United States Patent
Anada et al.

(10) Patent No.: US 9,093,488 B2
(45) Date of Patent: Jul. 28, 2015

(54) AC-DRIVEN ELECTROSTATIC CHUCK

(71) Applicant: TOTO LTD., Kitakyushu-shi, Fukuoka (JP)

(72) Inventors: Kazuki Anada, Fukuoka-ken (JP); Kaduko Ishikawa, Fukuoka-ken (JP); Yuichi Yoshii, Fukuoka-ken (JP); Junji Yonezawa, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 14/344,736

(22) PCT Filed: Sep. 27, 2012

(86) PCT No.: PCT/JP2012/074866
§ 371 (c)(1),
(2) Date: Mar. 13, 2014

(87) PCT Pub. No.: WO2013/047647
PCT Pub. Date: Apr. 4, 2013

(65) Prior Publication Data
US 2014/0340813 A1 Nov. 20, 2014

(30) Foreign Application Priority Data

Sep. 30, 2011 (JP) ................................ 2011-217622
Sep. 20, 2012 (JP) ................................ 2012-207606

(51) Int. Cl.
*H02N 13/00* (2006.01)
*H01L 21/683* (2006.01)
*H01L 21/687* (2006.01)

(52) U.S. Cl.
CPC ........ *H01L 21/6833* (2013.01); *H01L 21/6875* (2013.01); *H02N 13/00* (2013.01)

(58) Field of Classification Search
USPC ........................................................ 361/234
See application file for complete search history.

(56) References Cited

U.S. PATENT DOCUMENTS

| 5,822,172 | A | 10/1998 | White | |
|---|---|---|---|---|
| 6,538,873 | B1 * | 3/2003 | Larsen | ............... 361/234 |
| 6,558,158 | B2 | 5/2003 | Yamaguchi | |
| 7,126,091 | B1 * | 10/2006 | Westfall | ............ 219/444.1 |
| 7,151,658 | B2 * | 12/2006 | Kellerman et al. | ....... 361/234 |

(Continued)

FOREIGN PATENT DOCUMENTS

| JP | H01-313954 A | 12/1989 |
|---|---|---|
| JP | H03-292753 A | 12/1991 |

(Continued)

*Primary Examiner* — Ronald W Leja
(74) *Attorney, Agent, or Firm* — Carrier Blackman & Associates, P.C.; Joseph P. Carrier; William D. Blackman

(57) ABSTRACT

According to an aspect of an embodiment of the invention, there is provided an AC-driven electrostatic chuck including: a dielectric substrate including protrusions formed on a major surface on a side of mounting a clamped object, and a bottom surface part formed around the protrusions; and an electrode provided on the dielectric substrate, the electrode including a plurality of electrode elements spaced from each other, the plurality of electrode elements being enabled to be applied with an AC voltage of mutually different phases, respectively, and the protrusions being arranged on the major surface with a prescribed spacing depending on shape of the plurality of electrode elements. The AC-driven electrostatic chuck is capable of suppressing local damage to part of the protrusions provided on the mounting surface side.

25 Claims, 30 Drawing Sheets

(56) References Cited

U.S. PATENT DOCUMENTS

| | | | |
|---|---|---|---|
| 7,352,554 B2 * | 4/2008 | Lagos | 361/234 |
| 7,357,115 B2 * | 4/2008 | Parks | 123/200 |
| 8,004,817 B2 * | 8/2011 | Peitzsch | 361/234 |
| 8,730,644 B2 * | 5/2014 | Fujisawa et al. | 361/234 |
| 2003/0165044 A1 | 9/2003 | Yamamoto | |
| 2004/0040665 A1 | 3/2004 | Mizuno et al. | |
| 2006/0021705 A1 | 2/2006 | Imai et al. | |
| 2009/0168292 A1 * | 7/2009 | Watanabe et al. | 361/234 |
| 2010/0046134 A1 * | 2/2010 | Mizuno et al. | 361/234 |

FOREIGN PATENT DOCUMENTS

| | | |
|---|---|---|
| JP | H11-504760 A | 4/1999 |
| JP | 11-233600 A | 8/1999 |
| JP | 2002-124367 A | 4/2002 |
| JP | 2003-332412 A | 11/2003 |
| JP | 2004-022889 A | 1/2004 |
| JP | 2006-013302 A | 1/2006 |
| TW | 201026582 A | 7/2010 |
| WO | 2010/044398 A1 | 4/2010 |

\* cited by examiner

AC-DRIVEN ELECTROSTATIC CHUCK

TECHNICAL FIELD

Embodiments of the invention relate generally to an AC-driven electrostatic chuck.

BACKGROUND ART

An electrostatic chuck is used as a means for suction holding an object to be clamped (such as a semiconductor wafer and glass substrate) in substrate processing apparatuses for performing etching, CVD (chemical vapor deposition), sputtering, ion implantation, ashing, light exposure, inspection and the like.

Here, particles may be generated if the mounting surface of the electrostatic chuck and the clamped object rub against each other. Furthermore, the clamping/declamping response of the clamped object may be degraded if the contact area between the mounting surface of the electrostatic chuck and the clamped object is large.

Thus, techniques are known for providing protrusions on the mounting surface side of the electrostatic chuck to decrease the contact area, thereby suppressing particle contamination and improving the clamping/declamping response of the clamped object.

On the other hand, there is known an electrostatic chuck device based on application of polyphase AC voltage so that no electrostatic elimination treatment is needed to declamp the clamped substrate and that there is no vibration of the clamped substrate (Patent Literature 1). However, in the electrostatic chuck device described in Patent Literature 1, AC voltage is applied between the polyphase electrode and the clamped substrate. Thus, there is an instant when the voltage between one of the polyphase electrodes and the clamped substrate becomes zero. Accordingly, the clamping force locally becomes zero in the portion of the clamped substrate located on the electrode applied with zero voltage. The original investigation by the inventor has revealed that this may cause local vibration of the clamped substrate or local rubbing between the clamped substrate and the mounting surface of the electrostatic chuck device.

Accordingly, in the case where protrusions are provided on the mounting surface side of the electrostatic chuck, the protrusion and the clamped substrate may locally rub against each other and cause local damage to part of the protrusions.

CITATION LIST

Patent Literature

[PTL 1]
  JP 2003-332412 A (Kokai)

SUMMARY OF INVENTION

Technical Problem

This invention has been made based on the understanding of the aforementioned problems. An object of the invention is to provide an AC-driven electrostatic chuck capable of suppressing local damage to part of the protrusions provided on the mounting surface side.

Solution to Problem

According to an aspect of an embodiment of the invention, there is provided an AC-driven electrostatic chuck including: a dielectric substrate including protrusions formed on a major surface on a side of mounting a clamped object, and a bottom surface part formed around the protrusions; and an electrode provided on the dielectric substrate, the electrode including a plurality of electrode elements spaced from each other, the plurality of electrode elements being enabled to be applied with an AC voltage of mutually different phases, respectively, and the protrusions being arranged on the major surface with a prescribed spacing depending on shape of the plurality of electrode elements.

DESCRIPTION OF EMBODIMENTS

Figure 1A:
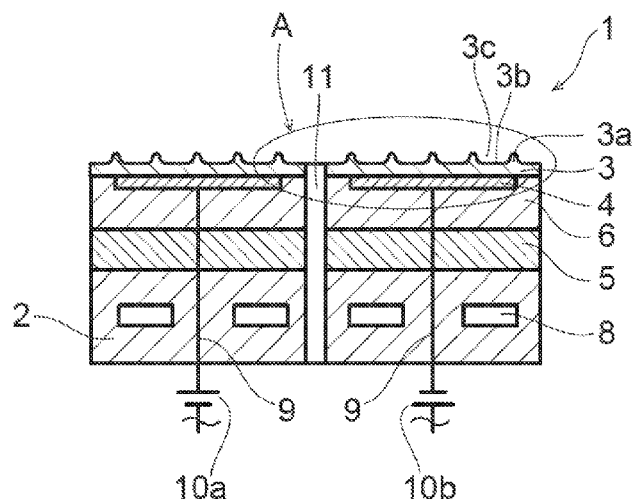
FIG. 1A to FIG. 1C are sectional schematic views for illustrating an AC-driven electrostatic chuck according to an embodiment of the invention.

A first aspect of the invention is an AC-driven electrostatic chuck comprising a dielectric substrate including protrusions formed on a major surface on a side of mounting a clamped object, and a bottom surface part formed around the protrusions; and an electrode provided on the dielectric substrate. The electrode includes a plurality of electrode elements spaced from each other. The plurality of electrode elements are enabled to be applied with an AC voltage of mutually different phases, respectively. The protrusions are arranged on the major surface with a prescribed spacing depending on shape of the plurality of electrode elements.

In this AC-driven electrostatic chuck, the protrusions are arranged on the major surface of the dielectric substrate with a prescribed spacing depending on the shape of the plurality of electrode elements. Thus, the displacement of the clamped object is made generally uniform, and the vibration thereof can be controlled. Furthermore, this can prevent local damage to part of the protrusions.

A second aspect of the invention is an AC-driven electrostatic chuck according to the first aspect of the invention, wherein the protrusions exist on a projection surface obtained by projecting the plurality of electrode elements on the major surface.

This AC-driven electrostatic chuck can further suppress the vibration of the clamped object. Furthermore, this can prevent local damage to part of the protrusions.

A third aspect of the invention is an AC-driven electrostatic chuck according to the first aspect of the invention, wherein the protrusions exist at positions not located on a projection surface obtained by projecting the plurality of electrode elements on the major surface.

This AC-driven electrostatic chuck can further suppress the vibration of the clamped object. Furthermore, this can prevent local damage to part of the protrusions.

A fourth aspect of the invention is an AC-driven electrostatic chuck according to the second aspect of the invention, wherein each of the plurality of electrode elements includes an extending portion, and the protrusions exist at positions not located on a center line extending in extending direction of the portion on a projection surface obtained by projecting the plurality of electrode elements on the major surface.

This AC-driven electrostatic chuck can further suppress the vibration of the clamped object. Furthermore, this can prevent local damage to part of the protrusions.

A fifth aspect of the invention is an AC-driven electrostatic chuck according to the third aspect of the invention, wherein a gap provided between adjacent ones of the plurality of electrode elements includes an extending portion, and the protrusions exist at positions not located on a center line extending in extending direction of the portion on a projection surface obtained by projecting the gap on the major surface.

This AC-driven electrostatic chuck can further suppress the vibration of the clamped object. Furthermore, this can prevent local damage to part of the protrusions.

A sixth aspect of the invention is an AC-driven electrostatic chuck according to the fourth aspect of the invention, wherein a plurality of the protrusions exist at positions symmetric with respect to the center line on the projection surface obtained by projecting the plurality of electrode elements on the major surface.

This AC-driven electrostatic chuck can further suppress the vibration of the clamped object. Furthermore, this can prevent local damage to part of the protrusions.

A seventh aspect of the invention is an AC-driven electrostatic chuck according to the fifth aspect of the invention, wherein a plurality of the protrusions exist at positions symmetric with respect to the center line on the projection surface obtained by projecting the gap on the major surface.

This AC-driven electrostatic chuck can further suppress the vibration of the clamped object. Furthermore, this can prevent local damage to part of the protrusions.

An eighth aspect of the invention is an AC-driven electrostatic chuck according to the second aspect of the invention, wherein a gap provided between adjacent ones of the plurality of electrode elements includes an extending portion, and a plurality of the protrusions exist at positions symmetric with respect to a center line extending in extending direction of the portion on the projection surface obtained by projecting the plurality of electrode elements on the major surface.

This AC-driven electrostatic chuck can further suppress the vibration of the clamped object. Furthermore, this can prevent local damage to part of the protrusions.

A ninth aspect of the invention is an AC-driven electrostatic chuck according to the second aspect of the invention, wherein each of the plurality of electrode elements includes an extending portion, and the protrusions exist on a center line extending in extending direction of the portion on the projection surface obtained by projecting the plurality of electrode elements on the major surface.

This AC-driven electrostatic chuck can prevent local damage to part of the protrusions.

A tenth aspect of the invention is an AC-driven electrostatic chuck according to the third aspect of the invention, wherein a gap provided between adjacent ones of the plurality of electrode elements includes an extending portion, and the protrusions exist on a center line extending in extending direction of the portion on a projection surface obtained by projecting the gap on the major surface.

This AC-driven electrostatic chuck can prevent local damage to part of the protrusions.

An eleventh aspect of the invention is an AC-driven electrostatic chuck according to the first aspect of the invention, wherein spacing between the adjacent protrusions arranged on a central part of the major surface is narrower than spacing between the adjacent protrusions arranged on an outer peripheral part of the major surface.

In this AC-driven electrostatic chuck, the protrusions are denser on the central part of the major surface of the dielectric substrate than on the outer peripheral part of the major surface of the dielectric substrate. This can prevent local damage to part of the protrusions arranged on the outer peripheral part of the major surface of the dielectric substrate.

A twelfth aspect of the invention is an AC-driven electrostatic chuck according to the first aspect of the invention, wherein spacing between the adjacent electrodes arranged on a central part of the major surface is narrower than spacing between the adjacent electrodes arranged on an outer peripheral part of the major surface.

In this AC-driven electrostatic chuck, the electrodes are denser on the central part of the major surface of the dielectric substrate than on the outer peripheral part of the major surface of the dielectric substrate. Thus, the protrusions are denser on the central part of the major surface of the dielectric substrate than on the outer peripheral part of the major surface of the dielectric substrate. This can prevent local damage to part of the protrusions arranged on the outer peripheral part of the major surface of the dielectric substrate.

A thirteenth aspect of the invention is an AC-driven electrostatic chuck according to the first aspect of the invention, wherein ratio of area of top surface of the protrusions arranged on a central part to total area of the major surface is higher than ratio of area of top surface of the protrusions arranged on an outer peripheral part to the total area of the major surface as viewed perpendicularly to the major surface.

In this AC-driven electrostatic chuck, the contact area with the clamped object of the protrusions arranged on the central part of the major surface of the dielectric substrate is larger than the contact area with the clamped object of the protrusions arranged on the outer peripheral part of the major surface of the dielectric substrate. This can prevent local damage to part of the protrusions arranged on the outer peripheral part of the major surface of the dielectric substrate.

A fourteenth aspect of the invention is an AC-driven electrostatic chuck according to the first aspect of the invention, wherein diameter of the protrusion arranged on an outer peripheral part of the major surface is equal to or larger than diameter of the protrusion arranged on a central part of the major surface.

For instance, in the case where this AC-driven electrostatic chuck is used in a substrate processing apparatus for performing ion implantation, the AC-driven electrostatic chuck is irradiated with beams. Thus, the clamped object such as a semiconductor wafer may thermally expand. If the clamped object thermally expands, the protrusions arranged on the outer peripheral part of the major surface of the dielectric substrate are more prone to chipping than the protrusions arranged on the central part of the major surface of the dielectric substrate. In this AC-driven electrostatic chuck, the diameter of the protrusion arranged on the outer peripheral part of the major surface of the dielectric substrate is equal to or larger than the diameter of the protrusion arranged on the central part of the major surface of the dielectric substrate. This can prevent local damage to part of the protrusions arranged on the outer peripheral part of the major surface of the dielectric substrate.

A fifteenth aspect of the invention is an AC-driven electrostatic chuck according to the ninth aspect of the invention, wherein the protrusions arranged on an outer peripheral part of the major surface are arranged at positions selectively shifted toward outer periphery compared with arrangement pattern of the protrusions arranged on a central part of the major surface as viewed perpendicularly to the major surface.

A sixteenth aspect of the invention is an AC-driven electrostatic chuck according to the tenth aspect of the invention, wherein the protrusions arranged on an outer peripheral part of the major surface are arranged at positions selectively shifted toward outer periphery compared with arrangement pattern of the protrusions arranged on a central part of the major surface as viewed perpendicularly to the major surface.

This AC-driven electrostatic chuck can reduce singular points prone to local damage to part of the protrusions.

A seventeenth aspect of the invention is an AC-driven electrostatic chuck according to the ninth aspect of the invention, wherein the protrusions arranged on a second track from outermost periphery as viewed perpendicularly to the major surface are arranged at positions selectively shifted toward outer periphery compared with arrangement pattern of the protrusions arranged on other than the second track from the outermost periphery as viewed perpendicularly to the major surface.

An eighteenth aspect of the invention is an AC-driven electrostatic chuck according to the tenth aspect of the invention, wherein the protrusions arranged on a second track from outermost periphery as viewed perpendicularly to the major surface are arranged at positions selectively shifted toward outer periphery compared with arrangement pattern of the protrusions arranged on other than the second track from the outermost periphery as viewed perpendicularly to the major surface.

This AC-driven electrostatic chuck can reduce singular points prone to local damage to part of the protrusions.

Embodiments of the invention will now be described with reference to the drawings. In the drawings, similar components are labeled with like reference numerals, and the detailed description thereof is omitted appropriately.

Figure 1B:
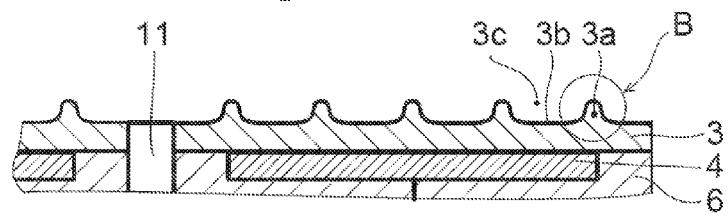
Figure 1C:
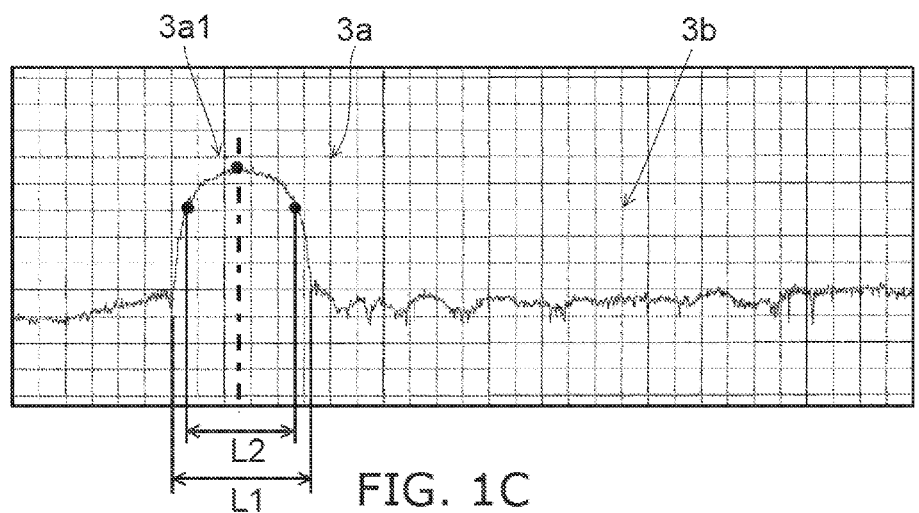

FIG. 1A to FIG. 1C are sectional schematic views for illustrating an AC-driven electrostatic chuck according to an embodiment of the invention.

Here, FIG. 1A is a sectional schematic view for illustrating the AC-driven electrostatic chuck. FIG. 1B is an enlarged schematic view of part A shown in FIG. 1A. FIG. 1C is a graph obtained by measuring part B shown in FIG. 1B using a contact-type roughness gauge.

As shown in FIG. 1A and FIG. 1B, the AC-driven electrostatic chuck 1 includes a base 2, a dielectric substrate 3, and an electrode 4.

An insulator layer 5 made of an inorganic material is formed on one major surface (the surface on the electrode 4 side) of the base 2. The dielectric substrate 3 includes protrusions 3a formed on a major surface on the side of mounting an object to be clamped (the mounting surface side), and a bottom surface part 3b formed around the protrusions 3a. The top surface of this protrusion 3a constitutes a mounting surface when an object to be clamped such as a semiconductor wafer is mounted thereon. In other words, the top surfaces of the protrusions will have the object mounted thereon without any intervening conductor therebetween.

The major surface of the dielectric substrate 3 provided with the electrode 4 is bonded to the major surface of the base 2 provided with the insulator layer 5 by an insulating adhesive. This insulating adhesive is cured to constitute a bonding layer 6. Here, the AC-driven electrostatic chuck 1 shown in FIG. 1A has a structure in which the dielectric substrate 3 and the insulator layer 5 are bonded together. However, as described later with reference to FIG. 2A and FIG. 2B, the AC-driven electrostatic chuck 1 may have a structure in which the electrode is incorporated in the dielectric substrate.

Here, the "top surface" in this description is described.

As shown in FIG. 1C, the "top surface" in this description refers to a portion of the protrusion 3a located in the range of length L2 across the central axis of the protrusion 3a. Here, L2 is the 80% length of the length L1 of the bottom part of the protrusion 3a.

The top surface 3a1 of the protrusion 3a has e.g. a curved surface. The outside of the top surface 3a1 may be a curved surface or a linear surface.

The electrodes 4 are connected with a power supply 10a and a power supply 10b by electric wires 9, respectively. Here, the electric wire 9 is provided so as to penetrate through the base 2, but insulated from the base 2. The AC-driven electrostatic chuck 1 illustrated in FIG. 1A to FIG. 1C is what is called a bipolar electrostatic chuck in which positive and negative electrodes are formed in the dielectric substrate 3 so as to be adjacent to each other. However, the embodiment is not limited thereto. The AC-driven electrostatic chuck 1 according to this embodiment may be of the tripolar or other multipolar type. Furthermore, the number, shape, and arrangement of the electrodes can be modified appropriately. This will be described later in detail.

A through hole 11 is provided so as to penetrate through the AC-driven electrostatic chuck 1. One end of the through hole 11 is opened to the bottom surface part 3b. The other end of the through hole 11 is connected to a gas supply means, not shown, through a pressure control means and a flow rate control means, not shown. The gas supply means for a cooling gas, not shown, supplies e.g. helium gas or argon gas. The space 3c provided by forming the bottom surface part 3b constitutes a path for the supplied gas. The spaces 3c communicate with each other so that the supplied gas is distributed entirely.

A ring-shaped protrusion, not shown, may be disposed at a position supporting the outer peripheral part of the clamped object when the clamped object such as a semiconductor wafer is mounted thereon. This can suppress leakage of the aforementioned gas. In the case where a through hole other than the aforementioned through hole 11 for gas supply is provided, a ring-shaped protrusion, not shown, may be disposed around that through hole. This can suppress leakage of the aforementioned gas.

Furthermore, a gas distribution groove (concave groove), not shown, communicating with the through hole 11 and having a radial or concentric shape can be provided on the bottom surface part 3b. The gas distribution groove thus provided can accelerate the gas distribution rate.

The base 2 is formed from e.g. a metal having high thermal conductivity such as aluminum alloy and copper. A flow channel 8 for the flow of cooling or heating liquid is provided inside the base 2. Here, the flow channel 8 is not necessarily needed, but preferably provided from the viewpoint of temperature control of the clamped object.

The insulator layer 5 provided on one major surface of the base 2 is formed from e.g. a polycrystal such as alumina ($Al_2O_3$) and yttria ($Y_2O_3$). The thermal conductivity of the insulator layer 5 is preferably higher than the thermal conductivity of the bonding layer 6. In this case, more preferably, the thermal conductivity of the insulator layer 5 is 2 W/mK or more. Then, heat transfer is made more favorable than in the case of using the bonding layer alone. This can improve the temperature controllability of the clamped object and the uniformity of the in-plane temperature.

A higher thermal conductivity of the bonding layer 6 is preferable. For instance, the thermal conductivity of the bonding layer 6 is preferably 1 W/mK or more, and more preferably 1.6 W/mK or more. Such thermal conductivity can be achieved by e.g. adding alumina or aluminum nitride as a filler to silicone or epoxy resin or the like. It is also possible to adjust the thermal conductivity by the ratio of addition.

The thickness of the bonding layer 6 is preferably as thin as possible in view of heat transfer. On the other hand, the thickness of the bonding layer 6 is preferably as thick as possible in view of e.g. peel-off of the bonding layer 6 by thermal shear stress due to the difference between the thermal expansion coefficient of the base 2 and the thermal expansion coefficient of the dielectric substrate 3. Thus, in view of these factors, the thickness of the bonding layer 6 is preferably 0.1 mm or more and 0.3 mm or less.

The dielectric substrate 3 can be made of various materials depending on different requirements for the electrostatic chuck. In this case, the dielectric substrate 3 is preferably formed from a polycrystalline ceramic sintered body in view of thermal conductivity and reliability in electrical insulation. The polycrystalline ceramic sintered body can be a polycrystalline ceramic sintered body made of e.g. alumina, yttria, aluminum nitride, or silicon carbide.

The volume resistivity of the material of the dielectric substrate 3 is e.g. $10^8$ Ωcm or more in the operating temperature region (e.g., room temperature (approximately 25° C.)) of the electrostatic chuck.

Here, the volume resistivity in this description is a value measured by using the method specified in the HS standard (JIS C 2141:1992, Testing methods of ceramic insulators for electrical and electronic applications). This measurement can be performed in the operating temperature region of the electrostatic chuck.

Examples of the material of the electrode 4 can include titanium oxide, elemental titanium, a mixture of titanium and titanium oxide, titanium nitride, titanium carbide, tungsten, gold, silver, copper, aluminum, chromium, nickel, and a gold-platinum alloy.

Figure 2A:
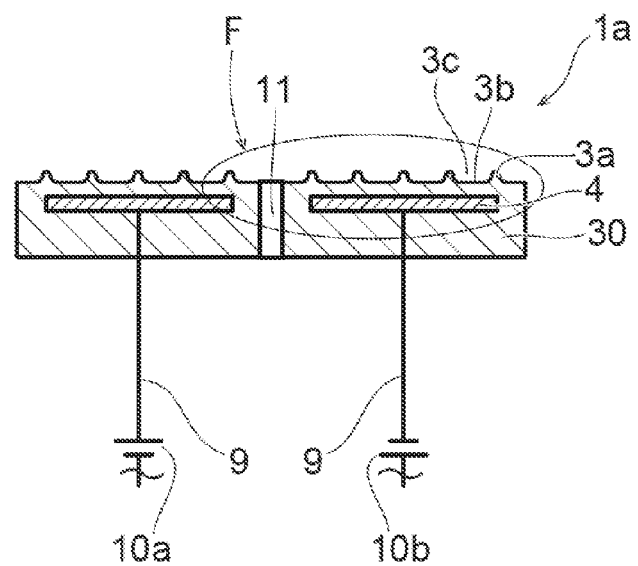
FIG. 2A and FIG. 2B are sectional schematic views for illustrating a variation of the AC-driven electrostatic chuck according to this embodiment.
Figure 2B:
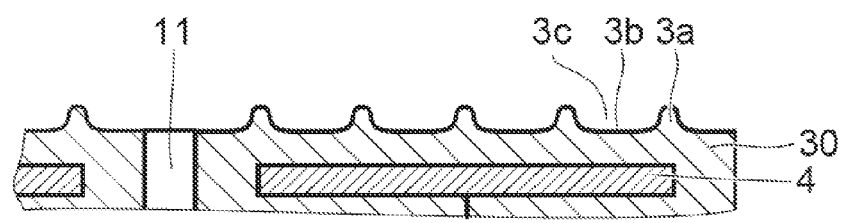

FIG. 2A and FIG. 2B are sectional schematic views for illustrating a variation of the AC-driven electrostatic chuck according to this embodiment.

Here, FIG. 2A is a sectional schematic view for illustrating the AC-driven electrostatic chuck. FIG. 2B is an enlarged schematic view of part F shown in FIG. 2A.

In the AC-driven electrostatic chuck 1a according to this variation, the electrode 4 is embedded inside the dielectric substrate 30. That is, the electrode 4 is incorporated inside the dielectric substrate 30.

This type of AC-driven electrostatic chuck 1a is manufactured by using e.g. the green sheet printing lamination method.

For instance, first, an electrode 4 is formed by screen printing a tungsten paste on a green sheet made of a polycrystalline ceramic molded body (e.g., polycrystalline alumina molded body). Then, a plurality of green sheets are pressure laminated so as to embed the electrode 4. Thus, a pre-sintered laminated body is formed. This laminated body is cut and processed into a desired shape, and sintered in a desired atmosphere. Thus, a dielectric substrate 30 with the electrode 4 embedded therein can be manufactured.

Figure 3:
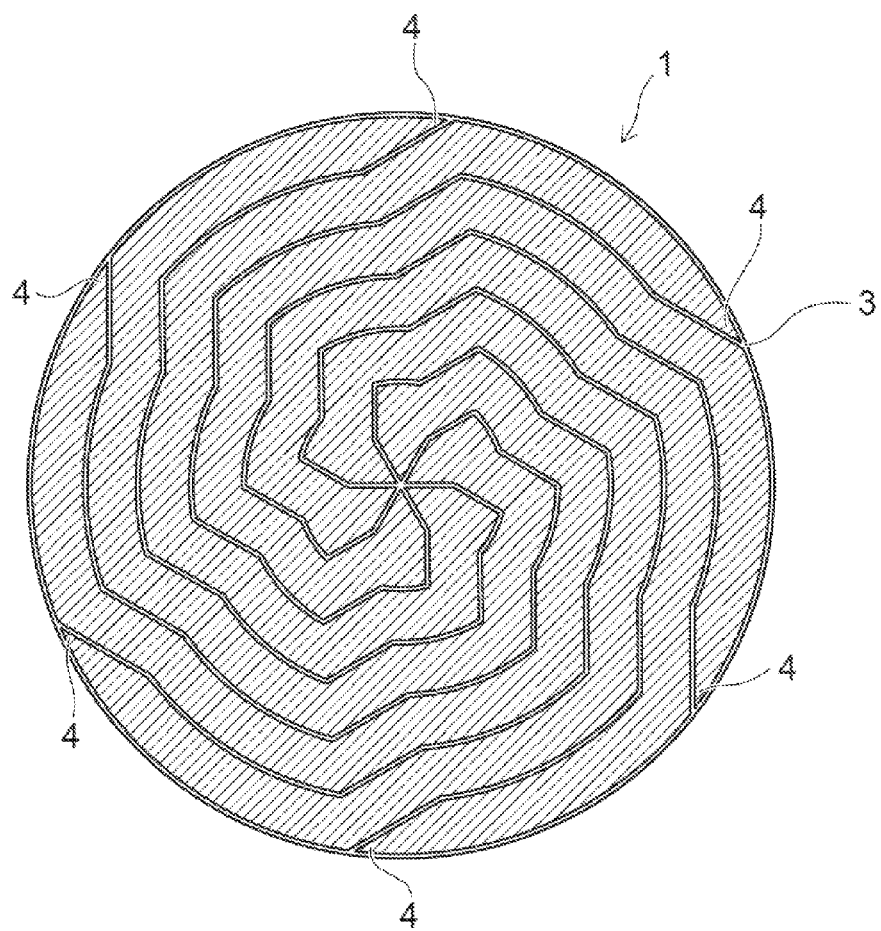
FIG. 3 is a plan schematic view illustrating an electrode pattern of this embodiment.

FIG. 3 is a plan schematic view illustrating an electrode pattern of this embodiment.

Figure 4A:
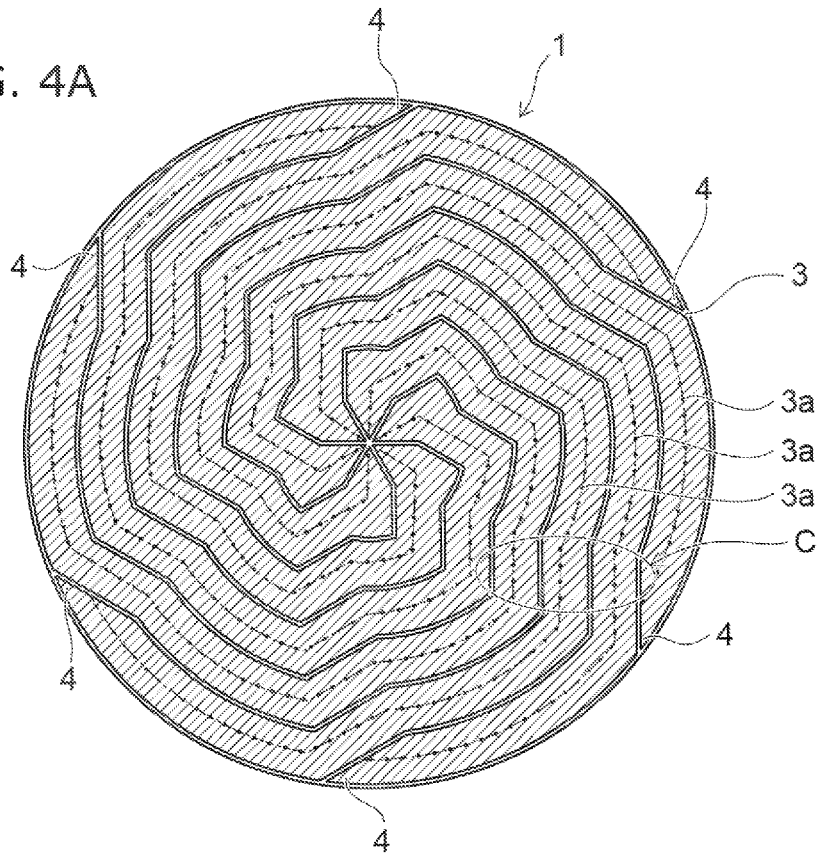
FIG. 4A and FIG. 4B are plan schematic views illustrating the arrangement relationship between the electrode and the protrusion of this embodiment.
Figure 4B:
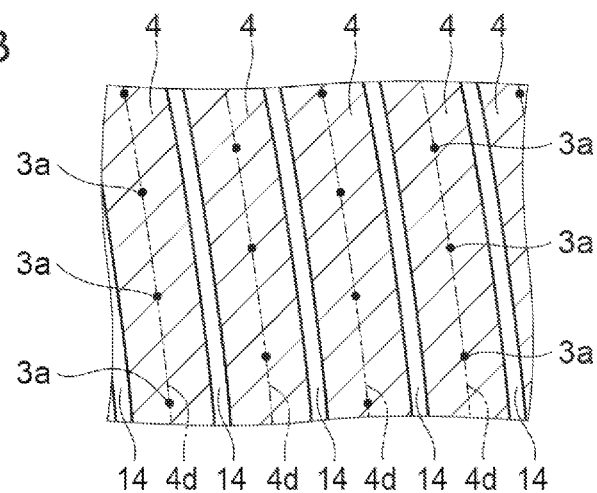

FIG. 4A and FIG. 4B are plan schematic views illustrating the arrangement relationship between the electrode and the protrusion of this embodiment.

Figure 5:
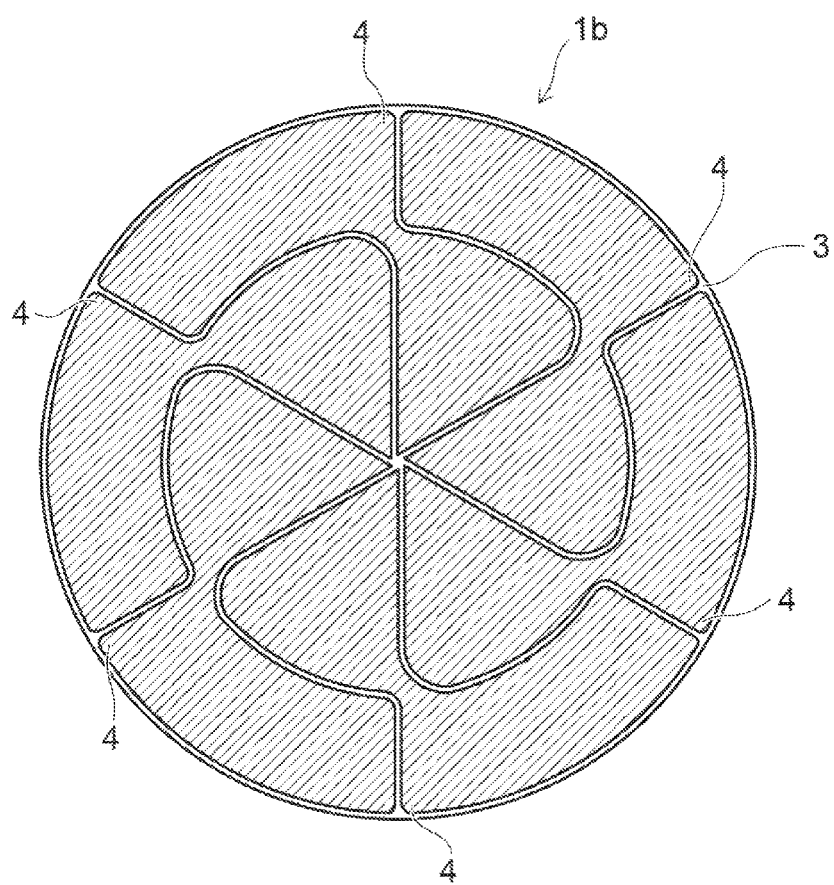
FIG. 5 is a plan schematic view illustrating an electrode pattern of an AC-driven electrostatic chuck according to a comparative example.

FIG. 5 is a plan schematic view illustrating an electrode pattern of an AC-driven electrostatic chuck according to a comparative example.

Figure 6A:
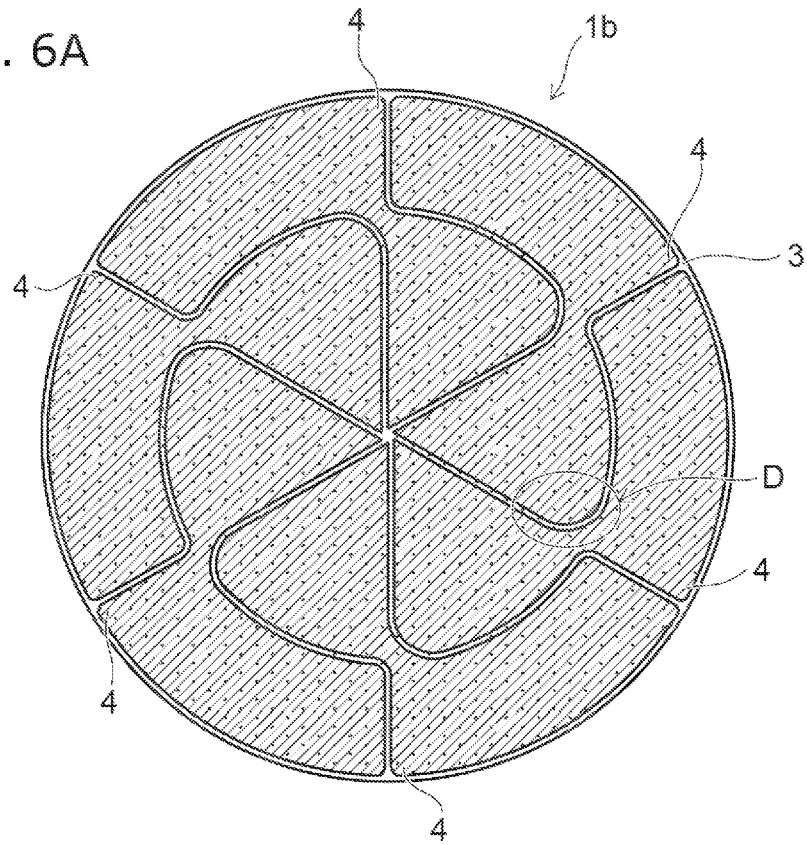
FIG. 6A and FIG. 6B are plan schematic views illustrating the arrangement relationship between the electrode and the protrusion of the AC-driven electrostatic chuck according to the comparative example.
Figure 6B:
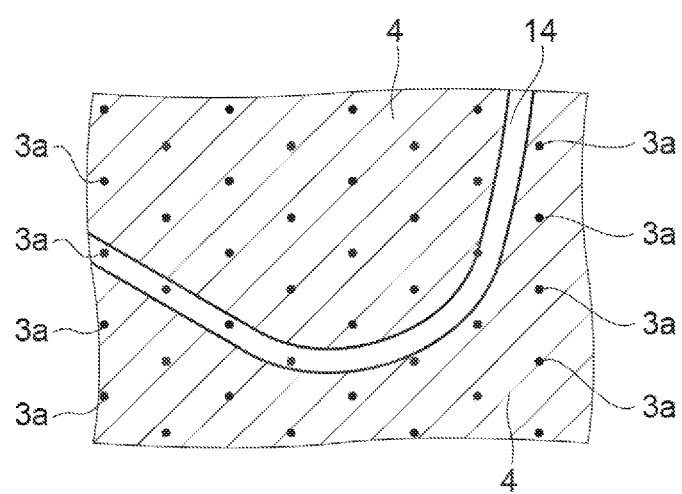

FIG. 6A and FIG. 6B are plan schematic views illustrating the arrangement relationship between the electrode and the protrusion of the AC-driven electrostatic chuck according to the comparative example.

Here, FIG. 4A and FIG. 6A are plan schematic views showing the AC-driven electrostatic chuck as viewed perpendicularly to the major surface of the dielectric substrate 3. FIG. 4B is an enlarged schematic view of part C shown in FIG. 4A. FIG. 6B is an enlarged schematic view of part D shown in FIG. 6A.

As shown in FIG. 3 and FIG. 4A, the AC-driven electrostatic chuck 1 according to this embodiment includes a plurality of electrodes 4. In other words, the electrode 4 includes a plurality of electrode elements. The plurality of electrode elements are spaced from each other. Thus, as shown in FIG. 4B, a portion (gap) 14 not provided with the electrode 4 exists between the mutually adjacent electrodes 4. In the AC-driven electrostatic chuck 1 shown in FIG. 3 and FIG. 4A, the plurality of electrode elements are arranged generally spirally. The plurality of electrode elements can be applied with an AC voltage of mutually different phases, respectively.

The AC-driven electrostatic chuck 1 shown in FIG. 3 and FIG. 4A includes six electrodes 4. The six electrodes 4 are paired two by two. That is, the six electrodes 4 form three pairs. Thus, the electrodes 4 having a pattern shown in FIG. 3 and FIG. 4A are applied with a three-phase AC voltage. For instance, at an arbitrary instant, the electrodes 4 forming a first pair (first-phase electrodes) are applied with a voltage of positive polarity. The electrodes 4 forming a second pair (second-phase electrodes) are applied with a voltage of negative polarity. The electrodes 4 forming a third pair (third-phase electrodes) are applied with no voltage. That is, the voltage applied to the electrodes 4 forming the third pair is zero. This type of application pattern of the three-phase AC voltage is switched with the passage of time.

In contrast, as shown in FIG. 5 and FIG. 6A, in the AC-driven electrostatic chuck 1b according to the comparative example, the width of the electrode 4 as viewed in the direction perpendicular to the extending direction of the electrode 4 (hereinafter referred to as "electrode width" for convenience of description) is wider than the electrode width of the electrode 4 of the AC-driven electrostatic chuck 1 shown in FIG. 3 and FIG. 4A.

In the AC-driven electrostatic chuck 1b according to the comparative example, the electrode 4 includes a plurality of electrode elements as in the AC-driven electrostatic chuck 1 described above with reference to FIG. 3, FIG. 4A, and FIG. 4B. The plurality of electrode elements are spaced from each other. Thus, as shown in FIG. 6B, a gap 14 exists between the mutually adjacent electrodes 4. The plurality of electrode elements can be applied with an AC voltage of mutually different phases, respectively.

As shown in FIG. 6A and FIG. 6B, in the AC-driven electrostatic chuck 1b according to the comparative example, the protrusions 3a are arranged generally equidistantly and generally uniformly on the generally entire dielectric substrate 3. In other words, the protrusions 3a are arranged generally equidistantly without depending on the shape of the plurality of electrode elements or the pattern of the plurality of electrode elements. That is, the protrusions 3a are arranged generally equidistantly independent of the shape of the plurality of electrode elements or the pattern of the plurality of electrode elements. The investigation by the inventor has revealed that in such cases, the protrusion 3a and the clamped substrate may locally rub against each other and cause local damage to part of the protrusions 3a. This is further described with reference to the drawings.

Figure 7A:
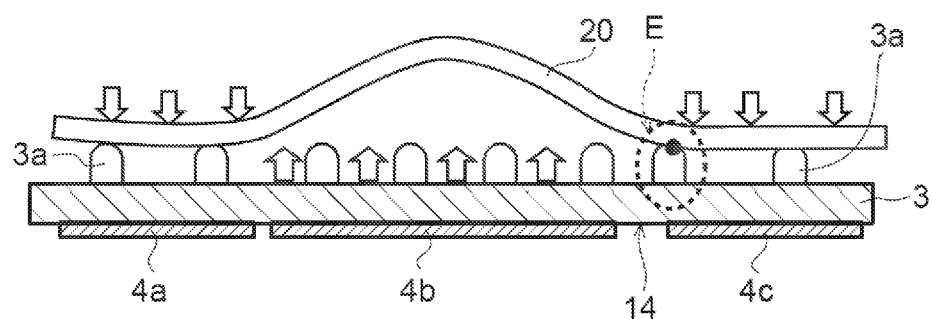
FIG. 7A and FIG. 7B are plan schematic views for describing local damage to the protrusion.
Figure 7B:
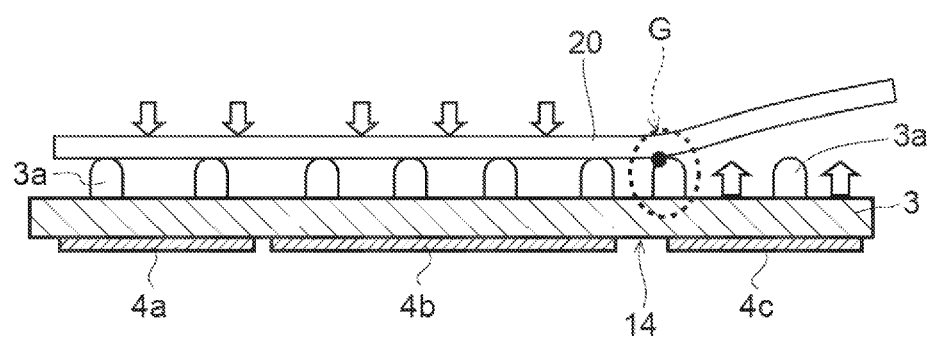

FIG. 7A and FIG. 7B are plan schematic views for describing local damage to the protrusion.

Figure 8A:
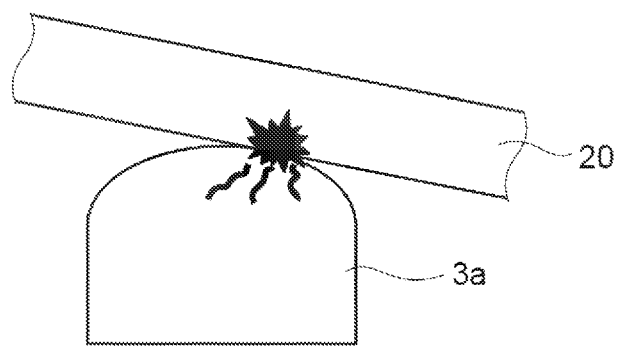
FIG. 8A to FIG. 8C are enlarged schematic views of the protrusion as viewed under magnification.
Figure 8B:
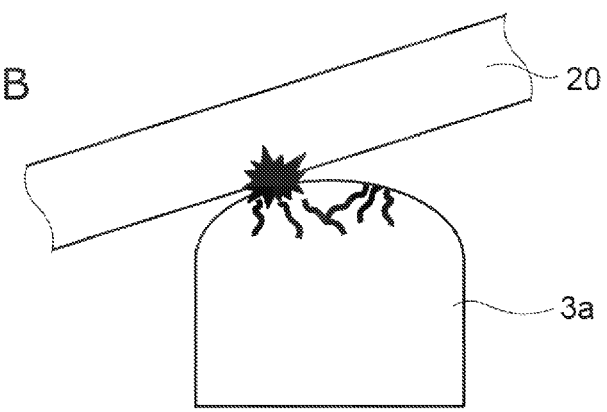
Figure 8C:
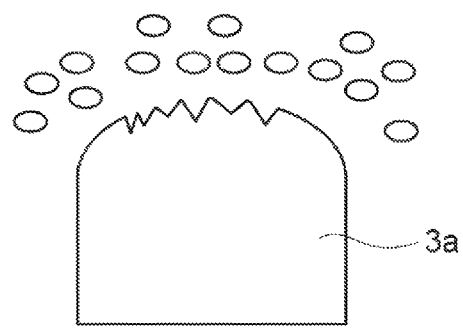

FIG. 8A to FIG. 8C are enlarged schematic views of the protrusion as viewed under magnification.

Figure 9:
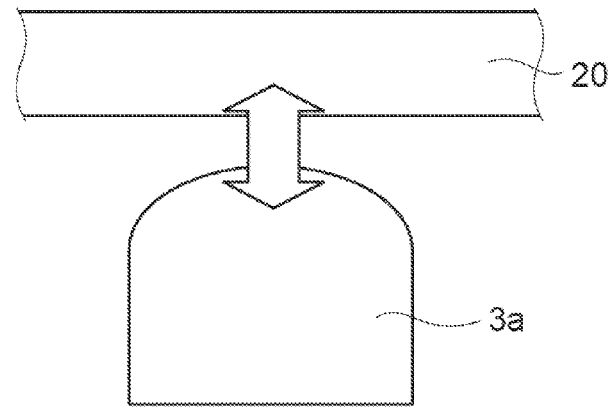
FIG. 9 is an enlarged schematic view of the protrusion of a DC-driven electrostatic chuck as viewed under magnification.

FIG. 9 is an enlarged schematic view of the protrusion of a DC-driven electrostatic chuck as viewed under magnification.

Here, FIG. 7A is a plan schematic view illustrating the case where the voltage applied to the second-phase electrode 4b is zero. FIG. 7B is a plan schematic view illustrating the case where the voltage applied to the third-phase electrode 4c is zero. The base 2 and the insulator layer 5 are not shown in FIG. 7A and FIG. 7B. FIG. 8A is an enlarged schematic view of part E shown in FIG. 7A. FIG. 8B is an enlarged schematic view of part G shown in FIG. 7B.

First, the action of the clamped object in a DC-driven electrostatic chuck is described with reference to FIG. 9.

In a DC-driven electrostatic chuck, when a DC voltage is applied to the electrode, the clamped object 20 is clamped and held on the DC-driven electrostatic chuck. At this time, the clamped object 20 is brought into contact with the protrusion 3a.

Subsequently, the DC voltage applied to the electrode is set to zero. Then, the clamping force applied to the clamped object is deactivated. Thus, the clamped object 20 can be declamped from the DC-driven electrostatic chuck. Subsequently, a similar operation is performed on the other clamped objects 20. Thus, the clamped object 20 and the protrusion 3a scarcely vibrate due to repetition of abutment or collision between the clamped object 20 and the protrusion 3a as indicated by the arrow shown in FIG. 9. Accordingly, there is little danger that the protrusion 3a and the clamped object 20 locally rub against each other and cause local damage to part of the protrusion 3a.

In contrast, an AC-driven electrostatic chuck may be used to improve e.g. the clamping/declamping response. As shown in FIG. 7A, for instance, at an arbitrary instant when the first-phase electrode 4a and the third-phase electrode 4c are applied with a voltage while the second-phase electrode 4b is applied with no voltage, the portion of the clamped object 20 located on the first-phase electrode 4a and the third-phase electrode 4c is clamped and held on the AC-driven electrostatic chuck 1 by the clamping force. At this time, the portion of the clamped object 20 located on the first-phase electrode 4a and the third-phase electrode 4c is brought into contact with the protrusion 3a.

On the other hand, at the arbitrary instant shown in FIG. 7A, the second-phase electrode 4b is applied with no voltage. Thus, no clamping force acts on the portion of the clamped object 20 located on the second-phase electrode 4b. Accordingly, the portion of the clamped object 20 located on the second-phase electrode 4b is floated up from the top surface (contact surface) of the protrusion 3a under the influence of the supplied gas and displaced in the direction away from the protrusion 3a. At this time, as shown in FIG. 8A, the protrusion 3a and the clamped object 20 may locally rub against each other and cause damage to the protrusion 3a.

Subsequently, the application pattern of the three-phase AC voltage is switched with the passage of time. Then, as shown in FIG. 7B, at an arbitrary instant when the first-phase electrode 4a and the second-phase electrode 4b are applied with a voltage while the third-phase electrode 4c is applied with no voltage, the portion of the clamped object 20 located on the first-phase electrode 4a and the second-phase electrode 4b is clamped and held on the AC-driven electrostatic chuck 1 by the clamping force. At this time, the portion of the clamped object 20 located on the first-phase electrode 4a and the second-phase electrode 4b is brought into contact with the protrusion 3a.

On the other hand, at the arbitrary instant shown in FIG. 7B, the third-phase electrode 4c is applied with no voltage. Thus, no clamping force acts on the portion of the clamped object 20 located on the third-phase electrode 4c. Accordingly, the portion of the clamped object 20 located on the third-phase electrode 4c is floated up from the top surface of the protrusion 3a and displaced in the direction away from the protrusion 3a.

At this time, as shown in FIG. 8B, the protrusion 3a and the clamped object 20 locally rub against each other at a site different from the site described above with reference to FIG. 8A where the protrusion 3a and the clamped object 20 locally rub against each other. This may cause damage to the protrusion 3a at a site different from the site described above with reference to FIG. 8A where the protrusion 3a is damaged.

Subsequently, the application pattern of the three-phase AC voltage is successively switched with the passage of time. Thus, the state described above with reference to FIG. 8A and the state described above with reference to FIG. 8B are repeated. This may cause local damage to part of the protrusion 3a. Then, as shown in FIG. 8C, the locally damaged portion of the protrusion 3a may be broken into particles. That is, repetition of not only collision but also rubbing between the clamped object 20 and the protrusion 3a may locally damage and break part of the protrusion 3a.

As the result of the investigation by the inventors, it has turned out that such local damage is comparatively likely to occur near the boundary between the mutually adjacent electrodes 4 or near the gap 14. Furthermore, it has turned out the aforementioned local damage is comparatively likely to occur if the electrode width of the electrode 4 is wider.

Thus, returning to FIG. 4A and FIG. 4B, in the AC-driven electrostatic chuck 1 according to this embodiment, the protrusions 3a are arranged with a prescribed spacing depending on the shape of the plurality of electrode elements or the pattern of the plurality of electrode elements. The term "depending on the shape of the plurality of electrode elements or the pattern of the plurality of electrode elements" shall include e.g. at least one of "reflecting the shape of the plurality of electrode elements or the pattern of the plurality of electrode elements", "in accordance with the shape of the plurality of electrode elements or the pattern of the plurality of electrode elements", "following the shape of the plurality of electrode elements or the pattern of the plurality of electrode elements", "in conformity with the shape of the plurality of electrode elements or the pattern of the plurality of electrode elements", and "based on the shape of the plurality of electrode elements or the pattern of the plurality of electrode elements". These will be described later with reference to specific examples.

Thus, the displacement of the clamped object 20 in the direction away from the protrusion 3a is made generally uniform, and the vibration thereof can be controlled. Furthermore, this can prevent local damage to part of the protrusions 3a.

As shown in FIG. 4B, the protrusions 3a exist on the projection surface obtained by projecting the plurality of electrode elements on the major surface of the dielectric substrate 3. Furthermore, as shown in FIG. 4B, each of the plurality of electrode elements includes an extending portion. The protrusions 3a exist on the center line 4d extending in the extending direction of the portion of each of the plurality of electrode elements (hereinafter referred to as "center line of the electrode" for convenience of description) on the projection surface obtained by projecting the plurality of electrode elements on the major surface of the dielectric substrate 3. This can further suppress the displacement amount of the clamped object 20. Furthermore, this can prevent local damage to part of the protrusions 3a.

As shown in FIG. 4A, the spacing between the adjacent electrodes 4 arranged on the central part of the major surface of the dielectric substrate 3 is narrower than the spacing between the adjacent electrodes 4 arranged on the outer peripheral part of the major surface of the dielectric substrate 3 as viewed perpendicularly to the major surface of the dielectric substrate 3. In other words, the electrode width of the electrode 4 arranged on the central part of the major surface of the dielectric substrate 3 is narrower than the electrode width of the electrode 4 arranged on the outer peripheral part of the major surface of the dielectric substrate 3. That is, the electrodes 4 are denser on the central part of the major surface of the dielectric substrate 3 than on the outer peripheral part of the major surface of the dielectric substrate 3.

Thus, the spacing between the adjacent protrusions 3a arranged on the central part of the major surface of the dielectric substrate 3 is narrower than the spacing between the adjacent protrusions 3a arranged on the outer peripheral part of the major surface of the dielectric substrate 3 as viewed perpendicularly to the major surface of the dielectric substrate 3. That is, the protrusions 3a are denser on the central part of the major surface of the dielectric substrate 3 than on the outer peripheral part of the major surface of the dielectric substrate 3. Thus, the ratio of the area of the top surface of the protrusions 3a arranged on the central part to the total area of the major surface of the dielectric substrate 3 is higher than the ratio of the area of the top surface of the protrusions 3a arranged on the outer peripheral part to the total area of the major surface of the dielectric substrate 3 as viewed perpendicularly to the major surface of the dielectric substrate 3. Thus, on comparison under an equal area, the contact area (the area of the top surface) with the clamped object 20 of the protrusions 3a arranged on the central part of the major surface of the dielectric substrate 3 is larger than the contact area (the area of the top surface) with the clamped object 20 of the protrusions 3a arranged on the outer peripheral part of the major surface of the dielectric substrate 3. Here, in the case where a ring-shaped protrusion is disposed at least on the outer peripheral part of the dielectric substrate 3 and around the through hole, not shown, the area of the top surface of the protrusions 3a shall include the area of the top surface of the ring-shaped protrusion.

Figure 10:
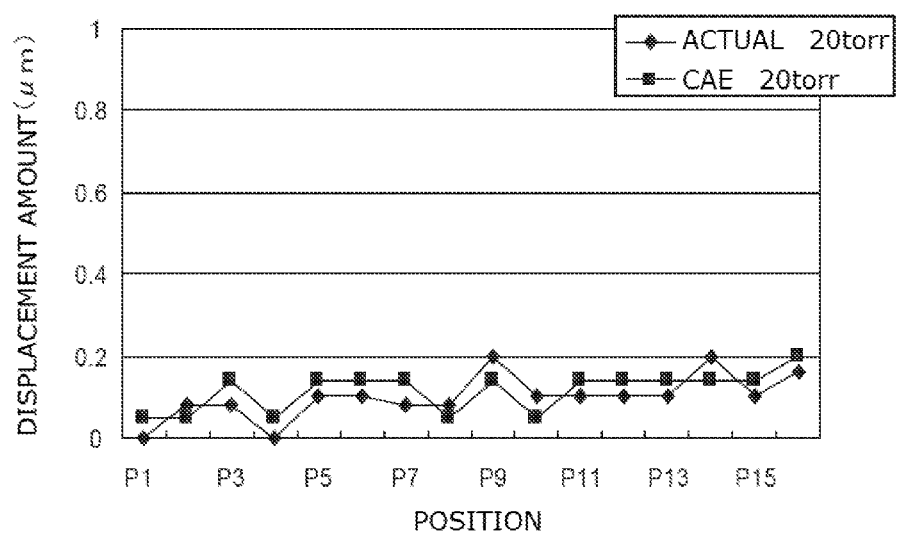
FIG. 10 is a graph illustrating an example of the measurement result and simulation result for the displacement amount of the clamped object performed by the inventor using the AC-driven electrostatic chuck according to this embodiment.

FIG. 10 is a graph illustrating an example of the measurement result and simulation result for the displacement amount of the clamped object performed by the inventor using the AC-driven electrostatic chuck according to this embodiment.

Figure 11:
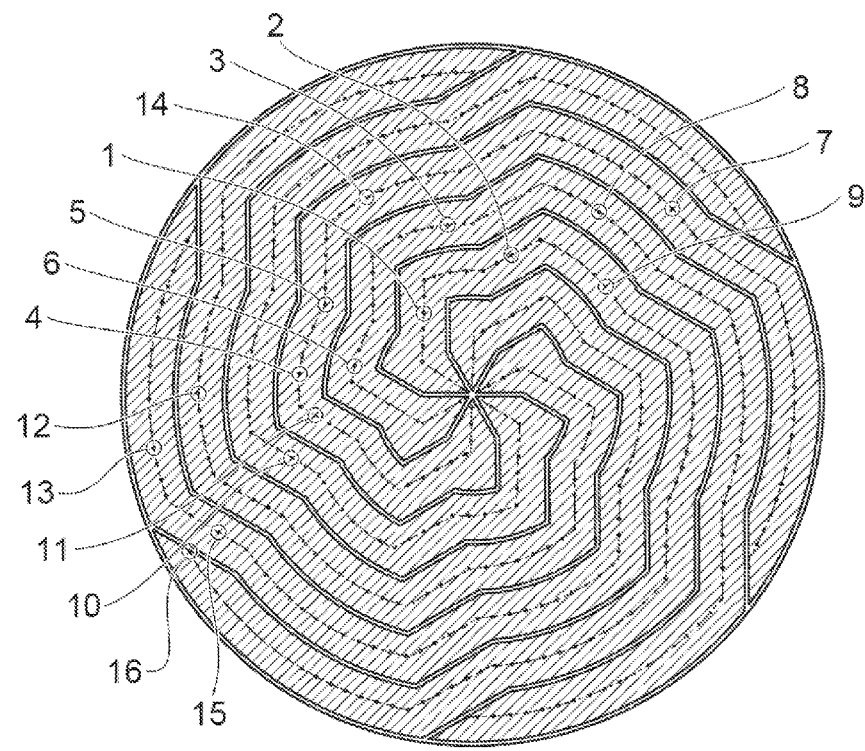
FIG. 11 is a plan schematic view illustrating measurement positions and data positions in the measurement result and simulation result shown in FIG. 10.

FIG. 11 is a plan schematic view illustrating measurement positions and data positions in the measurement result and simulation result shown in FIG. 10.

Figure 12:
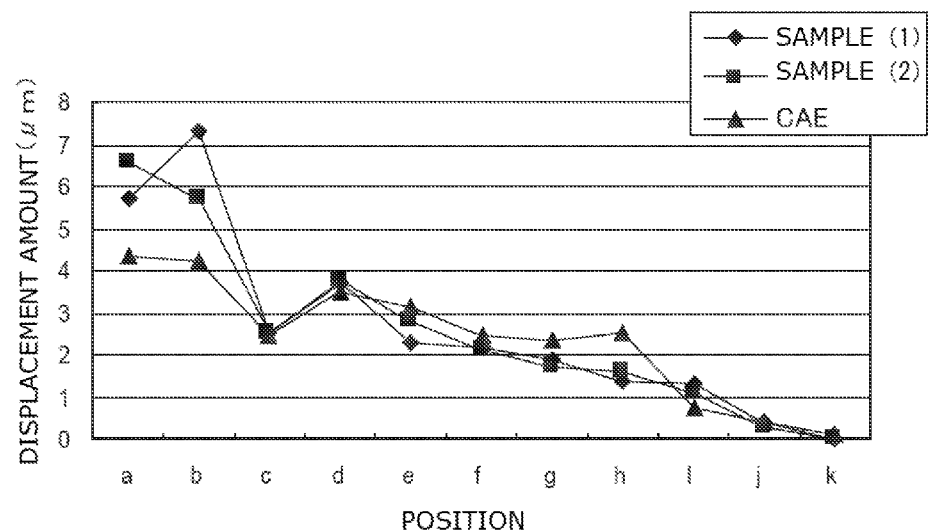
FIG. 12 is a graph illustrating an example of the measurement result and simulation result for the displacement amount of the clamped object performed by the inventor using the AC-driven electrostatic chuck according to the comparative example.

FIG. 12 is a graph illustrating an example of the measurement result and simulation result for the displacement amount of the clamped object performed by the inventor using the AC-driven electrostatic chuck according to the comparative example.

Figure 13:
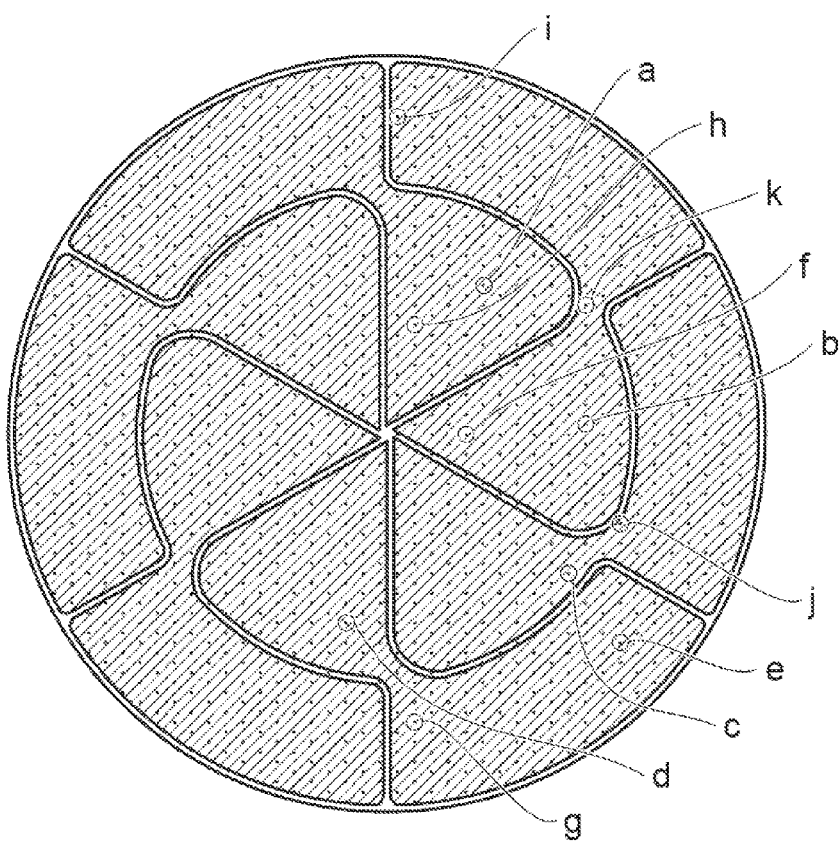
FIG. 13 is a plan schematic view illustrating measurement positions and data positions in the measurement result and simulation result shown in FIG. 12.

FIG. 13 is a plan schematic view illustrating measurement positions and data positions in the measurement result and simulation result shown in FIG. 12.

First, an example of the measurement result and simulation (CAE) result for the displacement amount in the AC-driven electrostatic chuck according to the comparative example is described with reference to FIG. 12 and FIG. 13. The horizontal axis of the graph shown in FIG. 12 represents the measurement position and the read data position. The vertical axis of the graph shown in FIG. 12 represents the displacement amount of the clamped object 20.

In this measurement and this simulation, the pressure of the gas supplied to the space 3c (see FIG. 1A, FIG. 1B, FIG. 2A, and FIG. 2B) was set to 20 Torr. The measurement positions and the read data positions are as shown in FIG. 13.

As indicated by the graph shown in FIG. 12, among positions a-k, the displacement amount of the clamped object 20 at position a and position b is larger than the displacement amount at the other positions. In the AC-driven electrostatic chuck 1 of sample (1) and sample (2), the displacement amount of the clamped object 20 at position a and position b is approximately 6-7 micrometers ($\mu$m). In the AC-driven electrostatic chuck of the simulation, the displacement amount of the clamped object 20 at position a and position b is approximately 4-5 $\mu$m.

On the other hand, among positions a-k, the displacement amount of the clamped object 20 at position j and position k is smaller than the displacement amount at the other positions. As shown in FIG. 13, the electrode width of the electrode 4 is narrower at position j and position k than at the other positions. Thus, it turns out that the displacement amount of the clamped object 20 can be decreased by narrowing the electrode width of the electrode 4.

In contrast, an example of the measurement result and simulation result for the displacement amount in the AC-driven electrostatic chuck according to this embodiment is described with reference to FIG. 10 and FIG. 11. The horizontal axis of the graph shown in FIG. 10 represents the measurement position and the read data position. The vertical axis of the graph shown in FIG. 10 represents the displacement amount of the clamped object 20.

In this measurement and this simulation, a 12-inch semiconductor wafer is mounted on the AC-driven electrostatic chuck 1 according to this embodiment in a chamber with the pressure reduced to $1\times10^{-3}$ pascals (Pa). The pressure of the gas supplied to the space 3c (see FIG. 1A, FIG. 1B, FIG. 2A, and FIG. 2B) is 20 Torr. The AC voltage applied to the electrode 4 is 1000 volts (V). Under this condition, a laser displacement meter was used to measure the displacement amount at measurement positions shown in FIG. 11. In the simulation, data at positions shown in FIG. 11 were read.

As indicated by the graph shown in FIG. 10, the displacement amount of the clamped object 20 at all positions 1-16 was approximately 0.2 $\mu$m in both actual measurement and simulation. That is, it has turned out that the AC-driven electrostatic chuck 1 according to this embodiment can suppress the displacement amount of the clamped object 20.

Figure 14:
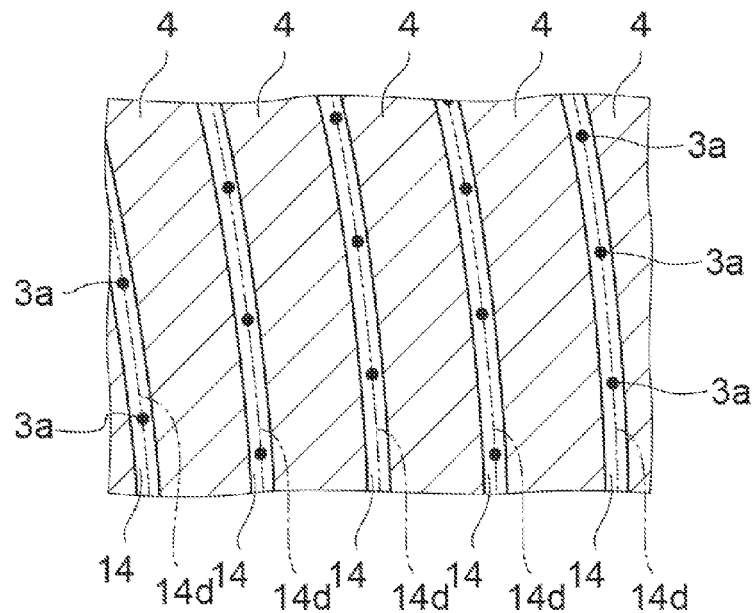
FIG. 14 is a plan schematic view illustrating an alternative arrangement relationship between the electrode and the protrusion of this embodiment.

FIG. 14 is a plan schematic view illustrating an alternative arrangement relationship between the electrode and the protrusion of this embodiment.

Here, FIG. 14 corresponds to an enlarged schematic view of part C shown in FIG. 4A.

In the arrangement relationship shown in FIG. 14, the protrusions 3a exist at positions not located on the projection surface obtained by projecting the plurality of electrode elements on the major surface of the dielectric substrate 3. That is, the protrusions 3a exist on the gap 14 of the electrodes 4 as projected on the major surface of the dielectric substrate 3. Furthermore, as shown in FIG. 14, the gap 14 includes an extending portion. The protrusions 3a exist on the center line 14d extending in the extending direction of the portion of the gap 14 (hereinafter referred to as "center line of the gaps" for convenience of description) on the projection surface obtained by projecting the gap 14 on the major surface of the dielectric substrate 3. This can further suppress the displacement amount of the clamped object 20. Furthermore, this can prevent local damage to part of the protrusions 3a.

Figure 15:
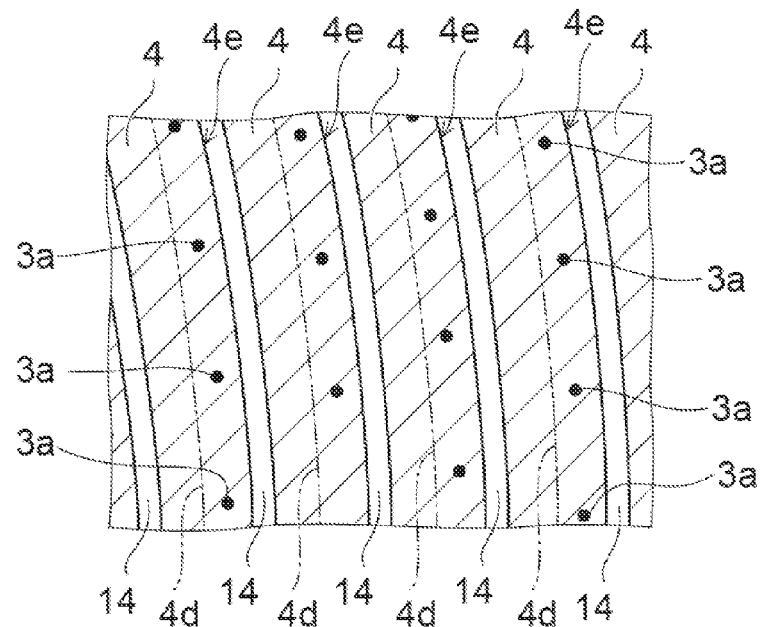
FIG. 15 is a plan schematic view illustrating a further alternative arrangement relationship between the electrode and the protrusion of this embodiment.

FIG. 15 is a plan schematic view illustrating a further alternative arrangement relationship between the electrode and the protrusion of this embodiment.

Here, FIG. 15 corresponds to an enlarged schematic view of part C shown in FIG. 4A.

In the arrangement relationship shown in FIG. 15, the protrusions 3a exist on the projection surface obtained by projecting the plurality of electrode elements on the major surface of the dielectric substrate 3. The protrusions 3a exist at positions not located on the center line 4d of the electrode 4 on the projection surface obtained by projecting the plurality of electrode elements on the major surface of the dielectric substrate 3.

Furthermore, the protrusions 3a exist at intermediate positions between the center line 4d of the electrode 4 and the end part 4e of the electrode 4 on the projection surface obtained by projecting the plurality of electrode elements on the major surface of the dielectric substrate 3. However, the positions of the protrusions 3a are not limited thereto. The protrusions 3a only need to exist at positions that are not located on the center line 4d of the electrode 4 on the projection surface obtained by projecting the plurality of electrode elements on the major surface of the dielectric substrate 3, and that are separated by a prescribed distance from the center line 4d of the electrode 4. In other words, the protrusions 3a only need to exist at positions such that the arrangement pitch of the protrusions 3a is an integer multiple of the arrangement pitch of the pattern of the electrodes 4. This can further suppress the displacement amount of the clamped object 20.

Figure 16:
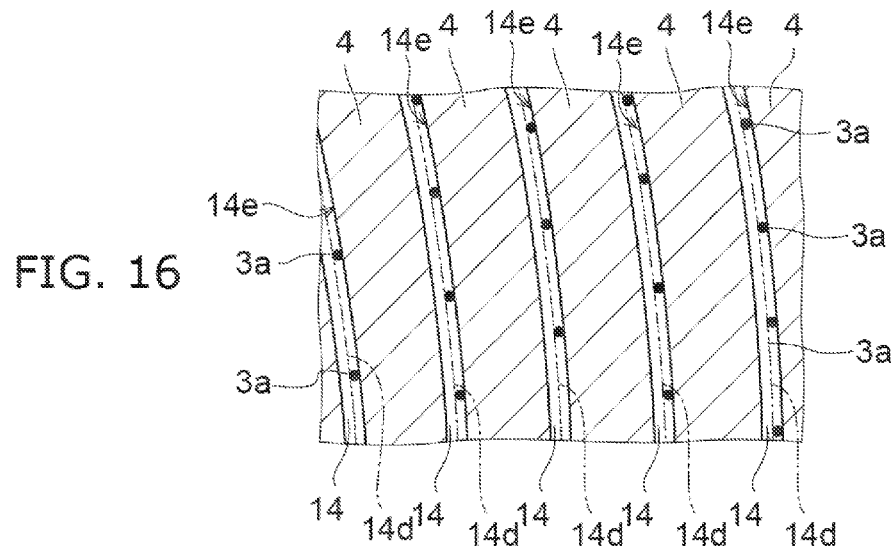
FIG. 16 is a plan schematic view illustrating a further alternative arrangement relationship between the electrode and the protrusion of this embodiment.

FIG. 16 is a plan schematic view illustrating a further alternative arrangement relationship between the electrode and the protrusion of this embodiment.

Here, FIG. 16 corresponds to an enlarged schematic view of part C shown in FIG. 4A.

In the arrangement relationship shown in FIG. 16, the protrusions 3a exist at positions not located on the projection surface obtained by projecting the plurality of electrode elements on the major surface of the dielectric substrate 3. The protrusions 3a exist at positions not located on the center line 14d of the gap 14 on the projection surface obtained by projecting the gap 14 on the major surface of the dielectric substrate 3.

Furthermore, the protrusions 3a exist at intermediate positions between the center line 14d of the gap 14 and the end part 14e of the gap 14 on the projection surface obtained by projecting the gap 14 on the major surface of the dielectric substrate 3. However, the positions of the protrusions 3a are not limited thereto. The protrusions 3a only need to exist at positions that are not located on the center line 14d of the gap 14 on the projection surface obtained by projecting the gap 14 on the major surface of the dielectric substrate 3, and that are separated by a prescribed distance from the center line 14d of the gap 14. In other words, the protrusions 3a only need to exist at positions such that the arrangement pitch of the protrusions 3a is an integer multiple of the arrangement pitch of the pattern of the gap 14. This can further suppress the displacement amount of the clamped object 20.

Figure 17A:
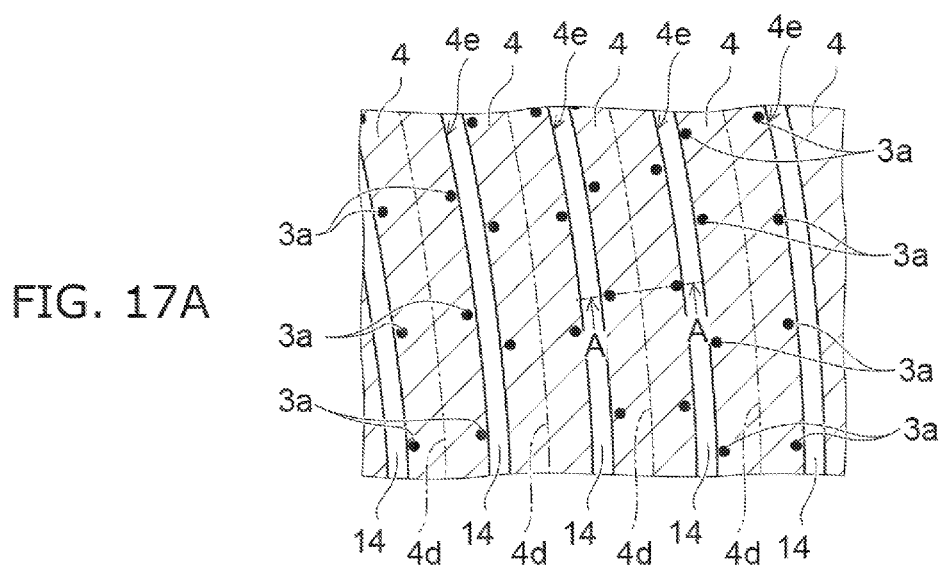
FIG. 17A and FIG. 17B are plan schematic views illustrating a further alternative arrangement relationship between the electrode and the protrusion of this embodiment.
Figure 17B:
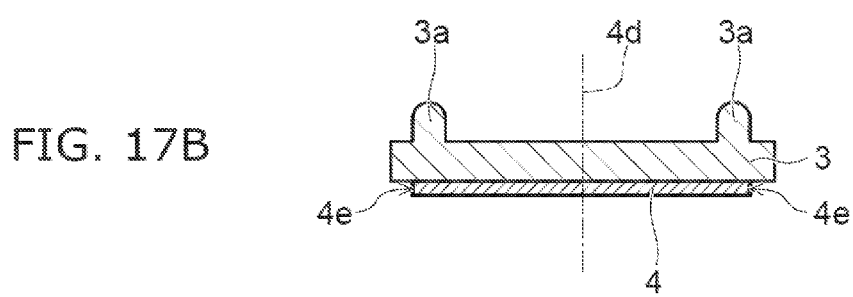

FIG. 17A and FIG. 17B are plan schematic views illustrating a further alternative arrangement relationship between the electrode and the protrusion of this embodiment.

Here, FIG. 17A corresponds to an enlarged schematic view of part C shown in FIG. 4A. FIG. 17B is a sectional schematic view at cross section A-A shown in FIG. 17A.

In the arrangement relationship shown in FIG. 17A and FIG. 17B, a plurality of protrusions 3a exist on the projection surface obtained by projecting the plurality of electrode elements on the major surface of the dielectric substrate 3. The plurality of protrusions 3a exist at positions not located on the center line 4d of the electrode 4 on the projection surface obtained by projecting the plurality of electrode elements on the major surface of the dielectric substrate 3.

Furthermore, the plurality of protrusions 3a exist at positions symmetric with respect to the center line 4d of the electrode 4 on the projection surface obtained by projecting the plurality of electrode elements on the major surface of the dielectric substrate 3. The positions of the plurality of protrusions 3a are not limited to the positions shown in FIG. 17A and FIG. 17B (e.g., the positions on the end part 4e of the electrode 4). For instance, the plurality of protrusions 3a may exist at intermediate positions between the center line 4d of the electrode 4 and the end part 4e of the electrode 4, instead of the positions on the end part 4e of the electrode 4, as long as the plurality of protrusions 3a exist at positions symmetric with respect to the center line 4d of the electrode 4 on the projection surface obtained by projecting the plurality of electrode elements on the major surface of the dielectric substrate 3. This can further suppress the displacement amount of the clamped object 20.

Figure 18A:
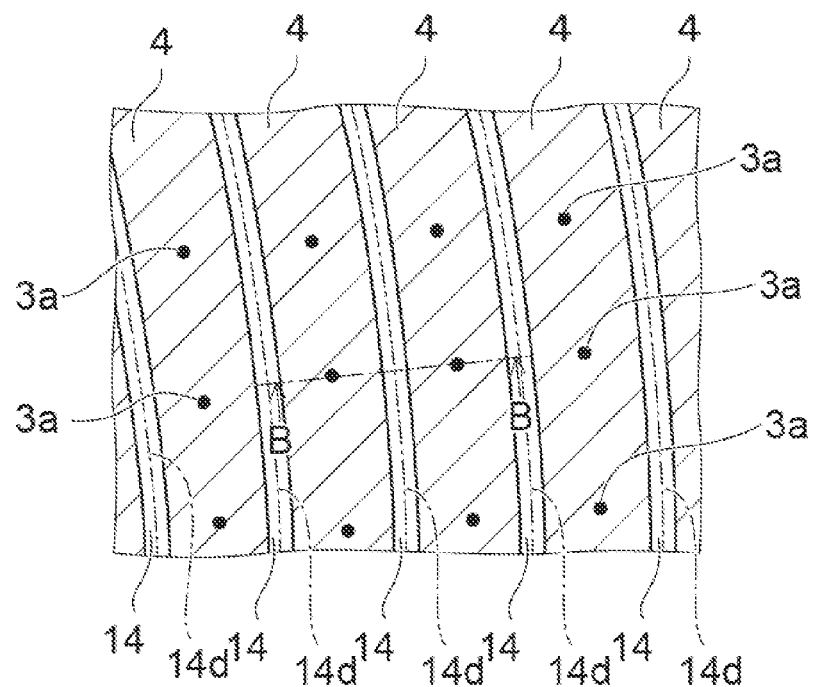
FIG. 18A and FIG. 18B are plan schematic views illustrating a further alternative arrangement relationship between the electrode and the protrusion of this embodiment.
Figure 18B:
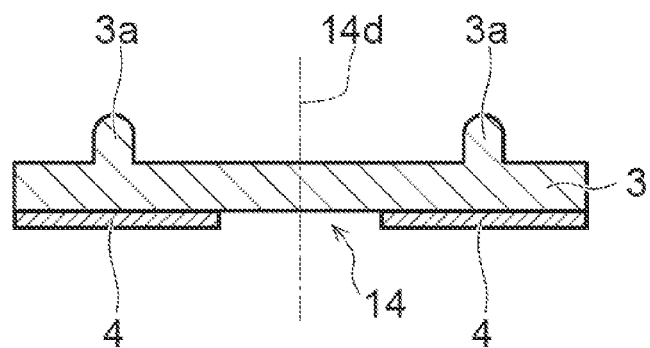

FIG. 18A and FIG. 18B are plan schematic views illustrating a further alternative arrangement relationship between the electrode and the protrusion of this embodiment.

Here, FIG. 18A corresponds to an enlarged schematic view of part C shown in FIG. 4A. FIG. 18B is a sectional schematic view at cross section B-B shown in FIG. 18A.

In the arrangement relationship shown in FIG. 18A and FIG. 18B, a plurality of protrusions 3a exist on the projection surface obtained by projecting the plurality of electrode elements on the major surface of the dielectric substrate 3.

Furthermore, the plurality of protrusions 3a exist at positions symmetric with respect to the center line 14d of the gap 14 on the projection surface obtained by projecting the plurality of electrode elements on the major surface of the dielectric substrate 3. The positions of the plurality of protrusions 3a are not limited to the positions shown in FIGS. 18A and 18B (e.g., the positions on the center line 4d of the electrode 4). This can further suppress the displacement amount of the clamped object 20.

Figure 19A:
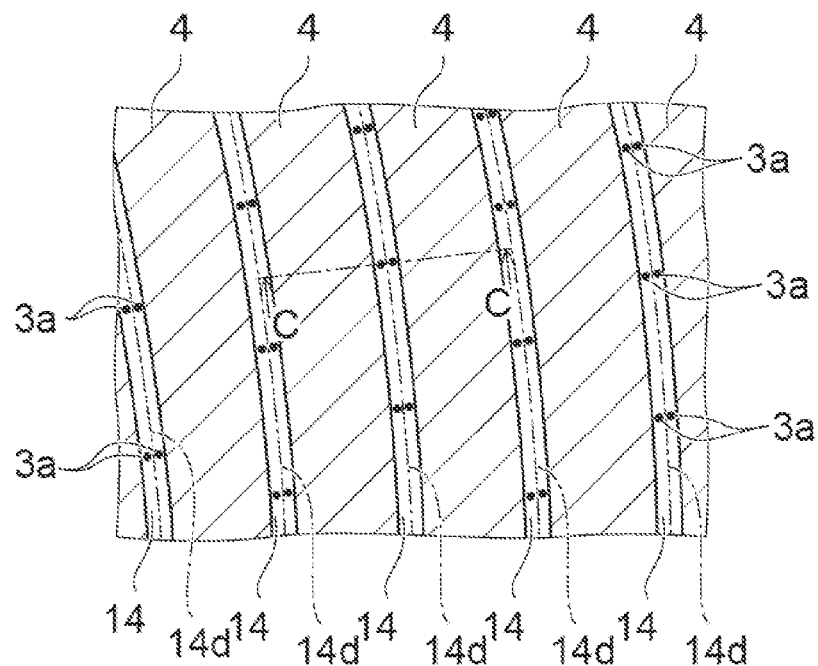
FIG. 19A and FIG. 19B are plan schematic views illustrating a further alternative arrangement relationship between the electrode and the protrusion of this embodiment.
Figure 19B:
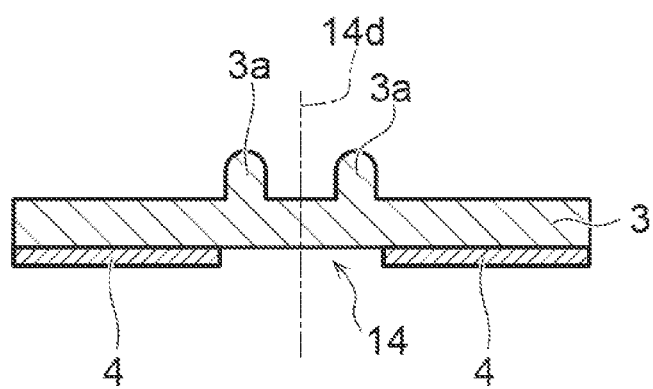

FIG. 19A and FIG. 19B are plan schematic views illustrating a further alternative arrangement relationship between the electrode and the protrusion of this embodiment.

Here, FIG. 19A corresponds to an enlarged schematic view of part C shown in FIG. 4A. FIG. 19B is a sectional schematic view at cross section C-C shown in FIG. 19A.

In the arrangement relationship shown in FIG. 19A and FIG. 19B, a plurality of protrusions 3a exist at positions not located on the projection surface obtained by projecting the plurality of electrode elements on the major surface of the dielectric substrate 3.

Furthermore, the plurality of protrusions 3a exist at positions symmetric with respect to the center line 14d of the gap 14 on the projection surface obtained by projecting the gap 14 on the major surface of the dielectric substrate 3. The positions of the plurality of protrusions 3a are not limited to intermediate positions between the center line 14d of the gap 14 and the end part 14e of the gap 14 (see FIG. 16). This can further suppress the displacement amount of the clamped object 20.

Here, the protrusions 3a having the arrangement relationship described above with reference to FIG. 18A and FIG. 18B may coexist with the protrusions 3a having the arrangement relationship described above with reference to FIG. 19A and FIG. 19B. That is, the plurality of protrusions 3a may exist at positions symmetric with respect to the center line 14d of the gap 14 on the projection surface obtained by projecting the plurality of electrode elements on the major surface of the dielectric substrate 3 and on the projection surface obtained by projecting the gap 14 on the major surface of the dielectric substrate 3.

Figure 20A:
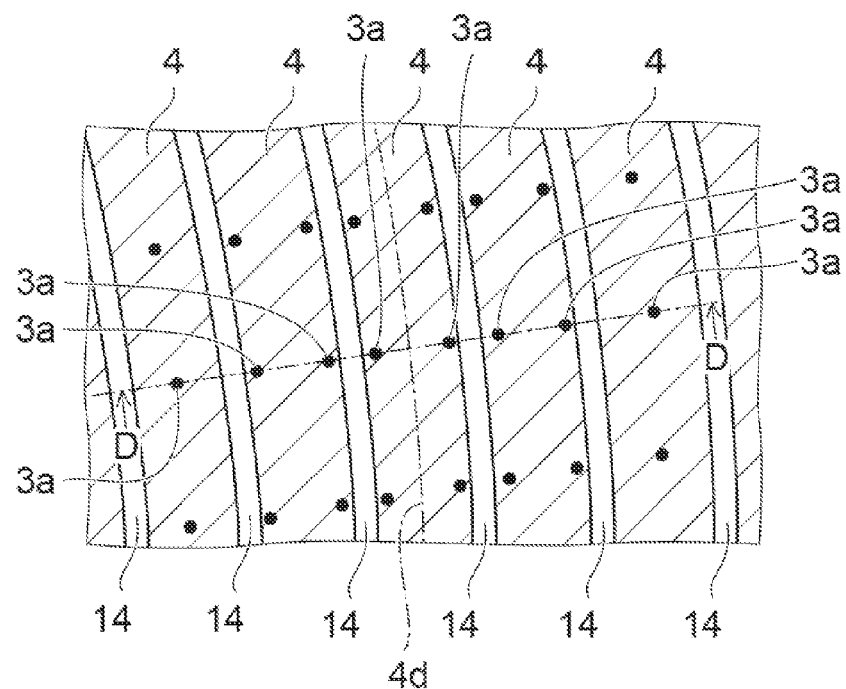
FIG. 20A and FIG. 20B are plan schematic views illustrating a further alternative arrangement relationship between the electrode and the protrusion of this embodiment.
Figure 20B:
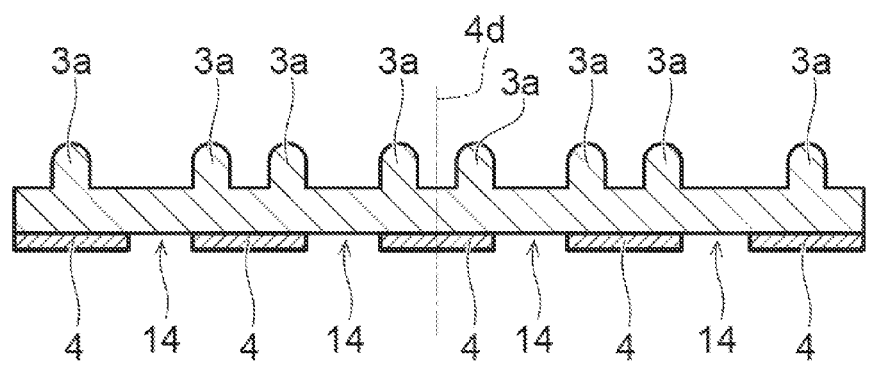

FIG. 20A and FIG. 20B are plan schematic views illustrating a further alternative arrangement relationship between the electrode and the protrusion of this embodiment.

Here, FIG. 20A corresponds to an enlarged schematic view of part C shown in FIG. 4A. FIG. 20B is a sectional schematic view at cross section D-D shown in FIG. 20A.

In the arrangement relationship shown in FIG. 20A and FIG. 20B, a plurality of protrusions 3a exist on the projection surface obtained by projecting the plurality of electrode elements on the major surface of the dielectric substrate 3.

Furthermore, the plurality of protrusions 3a exist at positions symmetric with respect to the center line 4d of one of a plurality of electrodes 4 (five electrodes 4 in FIG. 20A and FIG. 20B) on the projection surface obtained by projecting the plurality of electrode elements on the major surface of the dielectric substrate 3. The plurality of protrusions 3a do not necessarily need to exist on the projection surface obtained by projecting the plurality of electrode elements on the major surface of the dielectric substrate 3. That is, the plurality of protrusions 3a may exist on the gap 14 of the plurality of electrode elements as projected on the major surface of the dielectric substrate 3 as long as the plurality of protrusions 3a exist at positions symmetric with respect to the center line 4d of one of a plurality of electrodes 4. This can further suppress the displacement amount of the clamped object 20.

Figure 21:
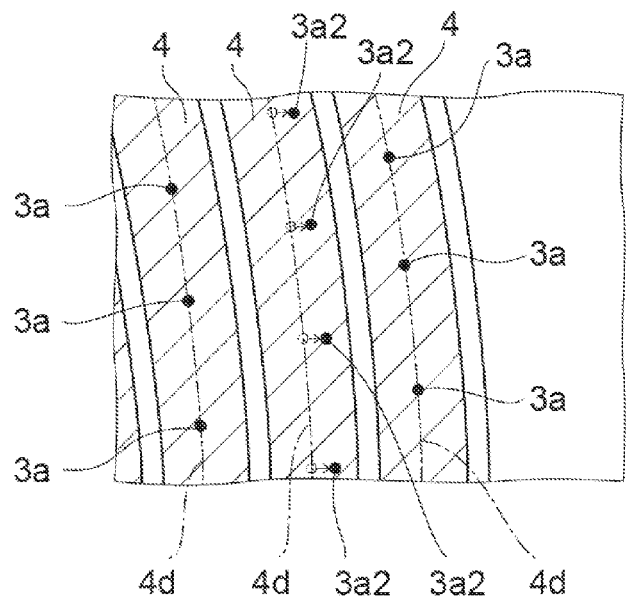
FIG. 21 is a plan schematic view illustrating a further alternative arrangement relationship between the electrode and the protrusion of this embodiment.

FIG. 21 is a plan schematic view illustrating a further alternative arrangement relationship between the electrode and the protrusion of this embodiment.

Figure 22A:
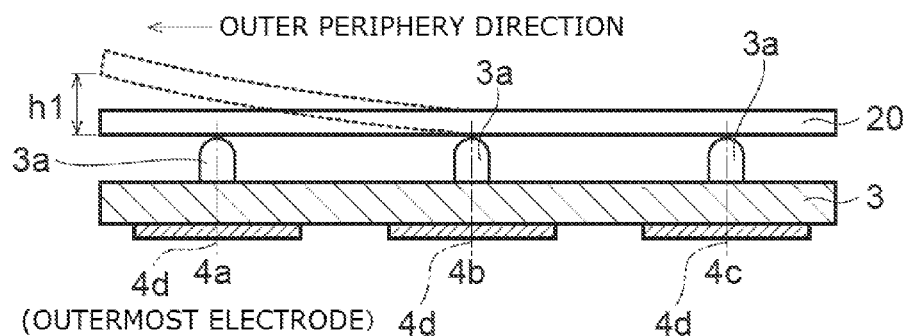
FIG. 22A and FIG. 22B are sectional schematic views in which the protrusions of this embodiment are selectively arranged.
Figure 22B:
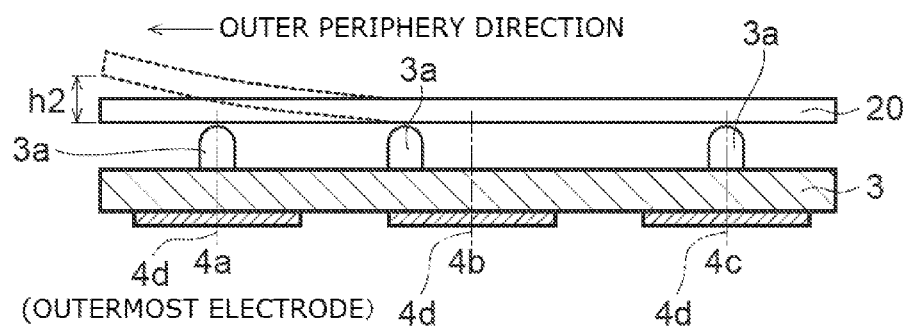

FIG. 22A and FIG. 22B are sectional schematic views in which the protrusions of this embodiment are selectively arranged.

Here, FIG. 21 corresponds to an enlarged schematic view of part C shown in FIG. 4A. FIG. 22A is a sectional schematic view illustrating the case where the protrusions exist on the center line 4d of the electrode 4. FIG. 22B is a sectional schematic view illustrating the case where the protrusions arranged on the second track from the outermost periphery are arranged at positions selectively shifted toward the outer periphery from the center line 4d of the electrode 4.

As the result of the investigation by the inventor, it has turned out that protrusions 3a subjected to relatively great damage are comparatively likely to be the protrusions 3a arranged on the second track from the outermost periphery as viewed perpendicularly to the major surface of the dielectric substrate 3.

Furthermore, as described above with reference to FIG. 7A to FIG. 8C, the application pattern of the three-phase AC voltage is switched with the passage of time. This causes local vibration of the clamped object 20, such as floating up from the protrusion 3a and abutting on the protrusion 3a. As the result of the investigation by the inventor, it has turned out that the displacement amount of the clamped object 20 is larger in the outer peripheral part as viewed perpendicularly to the major surface of the dielectric substrate 3.

This is described with reference to FIG. 22A and FIG. 22B. In the AC-driven electrostatic chuck shown in FIG. 22A, the protrusions 3a exist on the center line 4d of the electrode 4 on the projection surface obtained by projecting the plurality of electrode elements on the major surface of the dielectric substrate 3. Here, the first-phase electrode 4a shown in FIG. 22A is assumed to be the electrode 4 arranged at the outermost periphery as viewed perpendicularly to the major surface of the dielectric substrate 3. In contrast, in the AC-driven electrostatic chuck shown in FIG. 22B, the protrusions 3a arranged on other than the second track from the outermost periphery exist on the center line 4d of the electrode 4 on the projection surface obtained by projecting the plurality of electrode elements on the major surface of the dielectric substrate 3. On the other hand, the protrusions 3a arranged on the second track from the outermost periphery are arranged at positions selectively shifted toward the outer periphery from the center line 4d of the electrode 4. Here, the first-phase electrode 4a shown in FIG. 22B is assumed to be the electrode 4 arranged at the outermost periphery as viewed perpendicularly to the major surface of the dielectric substrate 3.

Here, when the electrode 4 at the outermost periphery (the first-phase electrode 4a in FIG. 22A and FIG. 22B) is applied with no voltage, the clamped object 20 is deformed starting from each protrusion 3a on the electrode 4 on the second track from the outermost periphery (the second-phase electrode 4b in FIG. 22A and FIG. 22B) as indicated by the dashed line shown in FIG. 22A and FIG. 22B. In this situation, in the AC-driven electrostatic chuck shown in FIG. 22B, the protrusions 3a arranged on the second track from the outermost periphery are arranged at positions selectively shifted toward the outer periphery from the center line 4d of the electrode 4 (second-phase electrode 4b). Thus, the displacement amount h2 of the clamped object 20 shown in FIG. 22B is smaller than the displacement amount h1 of the clamped object 20 shown in FIG. 22A. Accordingly, the protrusions 3a arranged on the second track from the outermost periphery are preferably arranged toward the outer periphery in order to reduce the displacement amount of the outer peripheral part of the clamped object 20.

Thus, in the AC-driven electrostatic chuck 1 according to this embodiment, the protrusions 3a near the outer peripheral part of the major surface of the dielectric substrate 3 are arranged at positions selectively shifted toward the outer periphery compared with the arrangement pattern of the other protrusions 3a. For instance, as shown in FIG. 21, the protrusions 3a arranged on other than the second track from the outermost periphery as viewed perpendicularly to the major surface of the dielectric substrate 3 exist on the center line 4d of the electrode 4. On the other hand, the protrusions 3a2 arranged on the second track from the outermost periphery as viewed perpendicularly to the major surface of the dielectric substrate 3 are arranged at positions selectively shifted toward the outer periphery from the center line 4d of the electrode 4. As the result of the investigation by the inventor, it has turned out that this can suppress the displacement of the portion of the clamped object 20 located on the protrusions 3a2 arranged on the second track from the outermost periphery as viewed perpendicularly to the major surface of the dielectric substrate 3. This can reduce singular points prone to local damage to part of the protrusions 3a, 3a2.

Figure 23A:
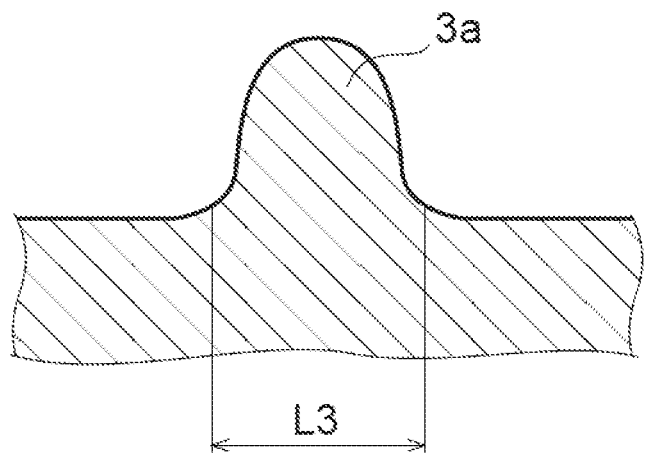
FIG. 23A and FIG. 23B are sectional schematic views for describing the diameter of the protrusion.
Figure 23B:
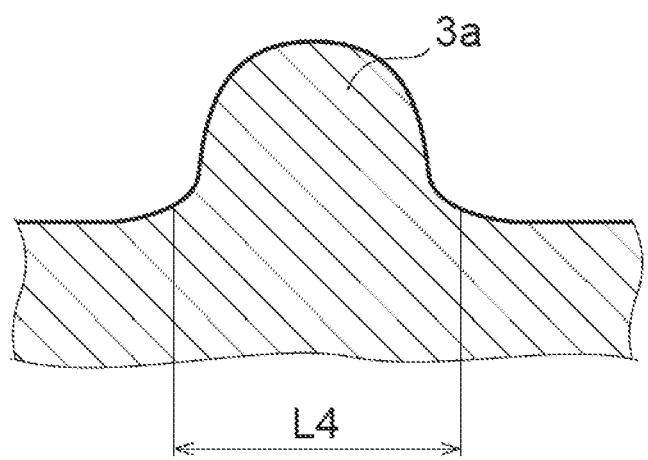

FIG. 23A and FIG. 23B are sectional schematic views for describing the diameter of the protrusion.

Here, FIG. 23A is a sectional schematic view showing the protrusion arranged on the central part of the major surface of the dielectric substrate. FIG. 23B is a sectional schematic view showing the protrusion arranged on the outer peripheral part of the major surface of the dielectric substrate.

For instance, in the case where the AC-driven electrostatic chuck according to this embodiment is used in a substrate processing apparatus for performing ion implantation, the AC-driven electrostatic chuck is irradiated with beams. Thus, the clamped object 20 such as a semiconductor wafer may thermally expand. As the result of the investigation by the inventor, it has turned out that if the clamped object 20 thermally expands, the protrusions 3a arranged on the outer peripheral part of the major surface of the dielectric substrate 3 are more prone to chipping than the protrusions 3a arranged on the central part of the major surface of the dielectric substrate 3.

Thus, as shown in FIG. 23A and FIG. 23B, in the AC-driven electrostatic chuck 1 according to this embodiment, the diameter L4 of the protrusion 3a arranged on the outer peripheral part of the major surface of the dielectric substrate 3 is larger than the diameter L3 of the protrusion 3a arranged on the central part of the major surface of the dielectric substrate 3. Alternatively, the diameter L4 of the protrusion 3a arranged on the outer peripheral part of the major surface of the dielectric substrate 3 is generally equal to the diameter L3 of the protrusion 3a arranged on the central part of the major surface of the dielectric substrate 3. That is, the diameter of the protrusion 3a is generally equal throughout the major surface of the dielectric substrate 3.

Here, in the case where the shape of the protrusion 3a as viewed perpendicularly to the major surface of the dielectric substrate 3 is not a circle, the diameter of the protrusion 3a shall refer to the circle equivalent diameter. In this description, the "circle equivalent diameter" shall refer to the diameter of a circle assumed to have the same area as the planar shape of interest. For instance, in the case where the shape of the protrusion 3a as viewed perpendicularly to the major surface of the dielectric substrate 3 is a polygon, the circle equivalent diameter means the diameter of a circle having the same area as that polygon.

This can suppress chipping and damaging of the protrusion 3a arranged on the outer peripheral part of the major surface of the dielectric substrate 3 even in the case where the clamped object 20 thermally expands.

Next, variations of the electrode pattern of this embodiment are described with reference to the drawings.

Figure 24:
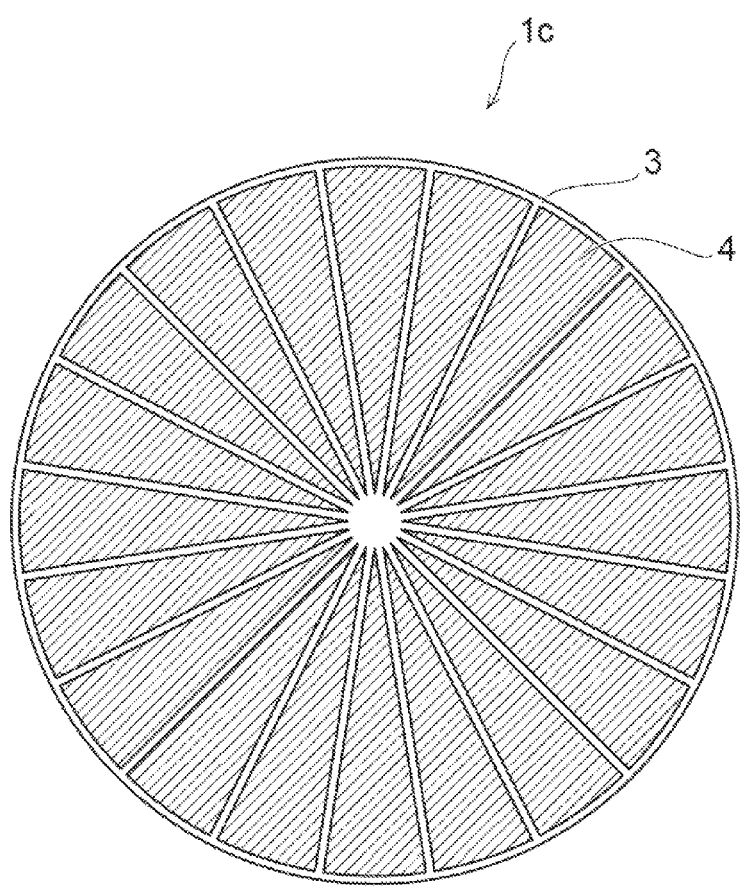
FIG. 24 is a plan schematic view illustrating a variation of the electrode pattern of this embodiment.

FIG. 24 is a plan schematic view illustrating a variation of the electrode pattern of this embodiment.

Here, FIG. 24 is a plan schematic view showing the AC-driven electrostatic chuck as viewed perpendicularly to the major surface of the dielectric substrate 3. This also applies to the variations described below with reference to FIG. 25 to FIG. 32.

The electrode 4 of the AC-driven electrostatic chuck 1c according to this variation is shaped like a sector. The electrodes 4 shaped like a sector are arranged generally uniformly in the circumferential direction.

Figure 25:
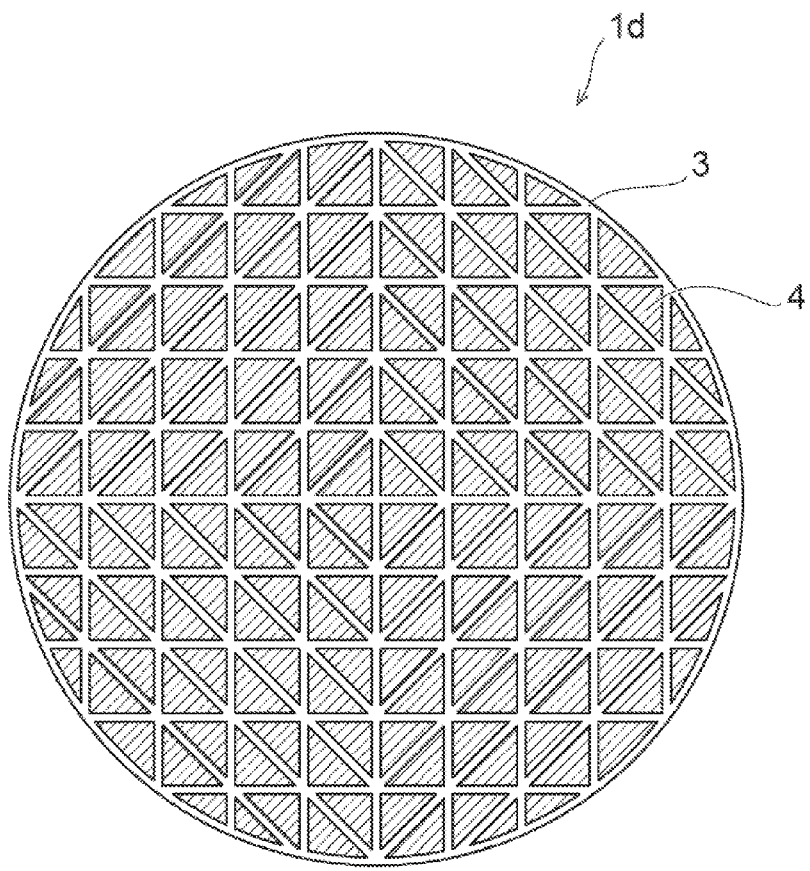
FIG. 25 is a plan schematic view illustrating an alternative variation of the electrode pattern of this embodiment.

FIG. 25 is a plan schematic view illustrating an alternative variation of the electrode pattern of this embodiment.

The electrode 4 of the AC-driven electrostatic chuck 1d according to this variation is shaped like a triangle. However, the electrode 4 arranged on the outer peripheral part of the major surface of the dielectric substrate 3 is not shaped like a triangle, but shaped so that one side of a triangle follows the shape of the outer periphery of the dielectric substrate 3. The electrodes 4 are arranged generally uniformly throughout the major surface of the dielectric substrate 3.

Figure 26:
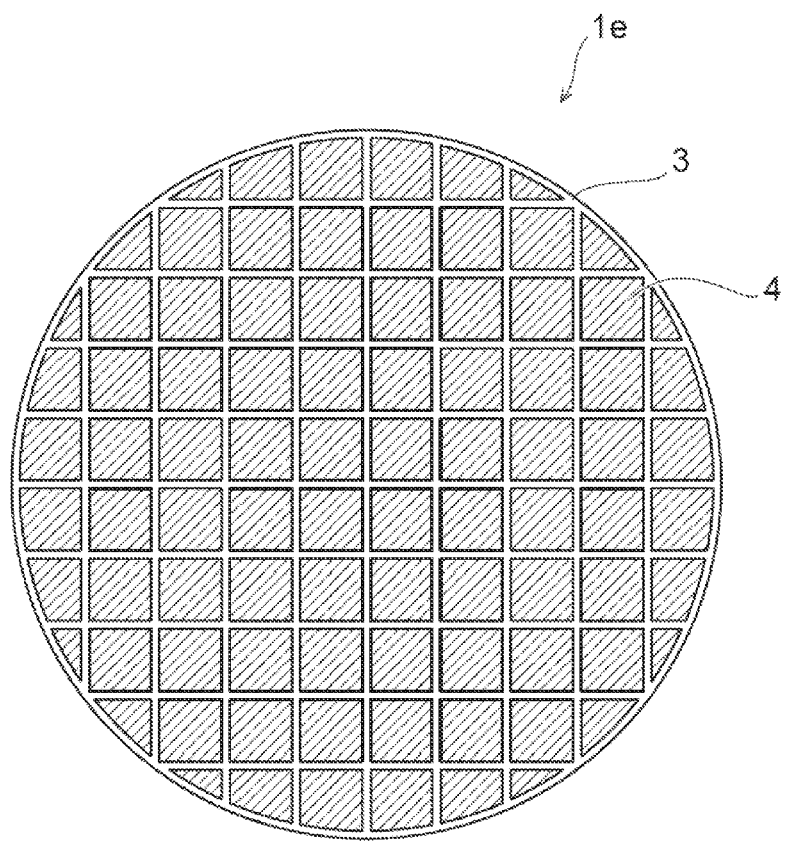
FIG. 26 is a plan schematic view illustrating a further alternative variation of the electrode pattern of this embodiment.

FIG. 26 is a plan schematic view illustrating a further alternative variation of the electrode pattern of this embodiment.

The electrode 4 of the AC-driven electrostatic chuck 1e according to this variation is shaped like a quadrangle. However, the electrode 4 arranged on the outer peripheral part of the major surface of the dielectric substrate 3 is not shaped like a quadrangle, but shaped so that one side of a quadrangle or triangle follows the shape of the outer periphery of the dielectric substrate 3. The electrodes 4 are arranged generally uniformly throughout the major surface of the dielectric substrate 3.

Figure 27:
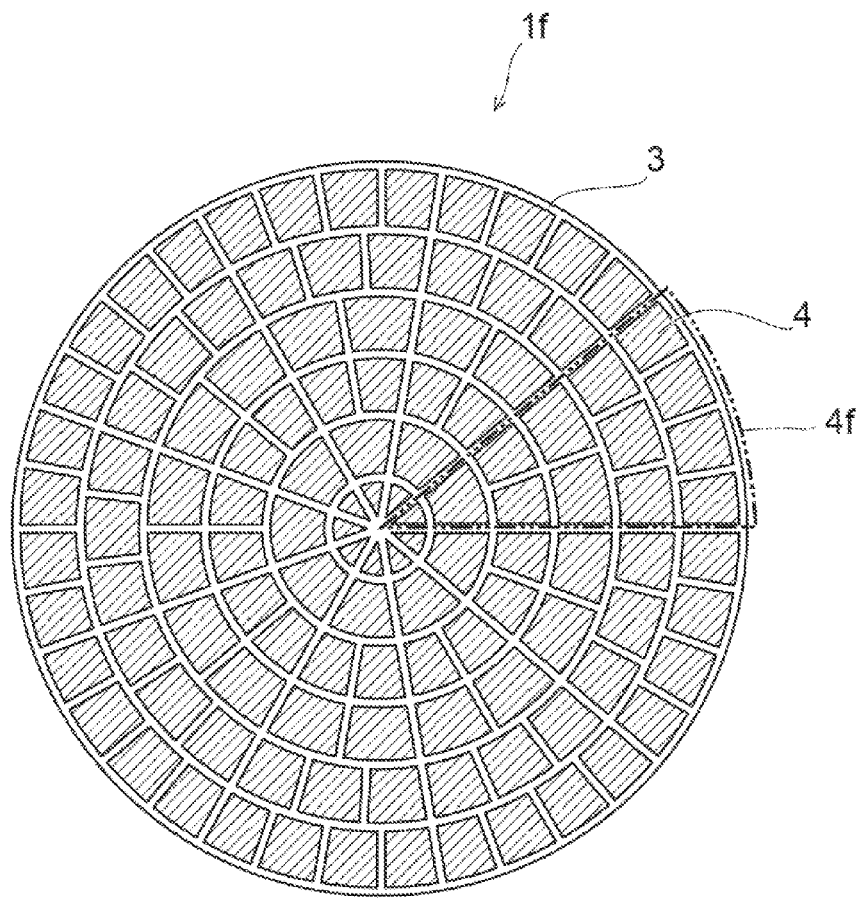
FIG. 27 is a plan schematic view illustrating a further alternative variation of the electrode pattern of this embodiment.

FIG. 27 is a plan schematic view illustrating a further alternative variation of the electrode pattern of this embodiment.

The electrode 4 of the AC-driven electrostatic chuck 1f according to this variation is shaped like part of a sector. A plurality of electrodes 4 inside the sector 4f indicated by the double-dotted dashed line form one group. The sectors 4f each grouping the plurality of electrodes 4 are arranged generally uniformly in the circumferential direction.

Figure 28:
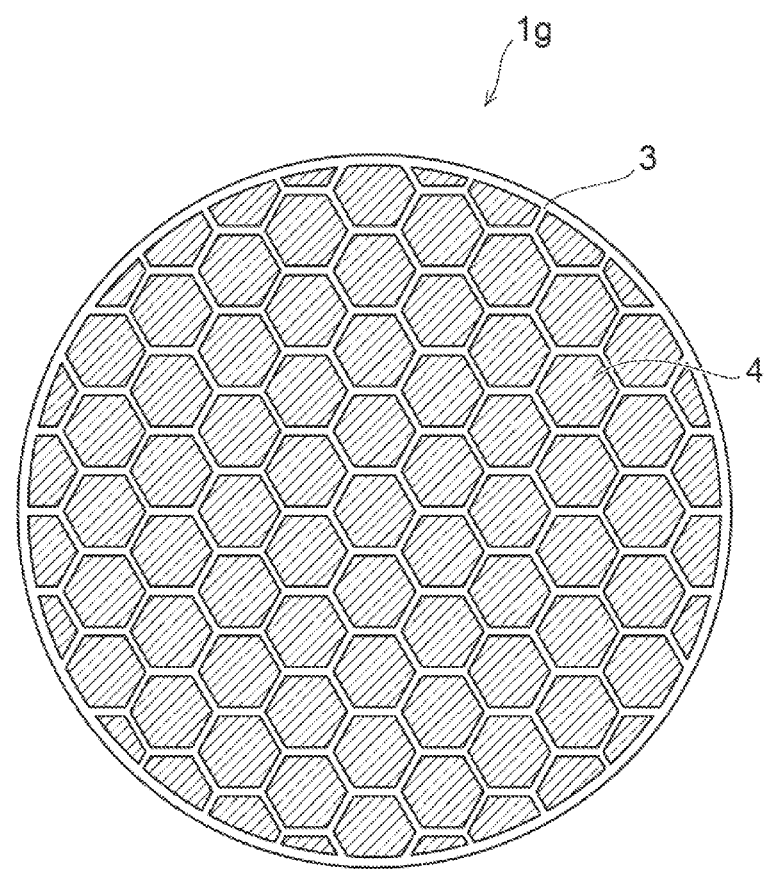
FIG. 28 is a plan schematic view illustrating a further alternative variation of the electrode pattern of this embodiment.

FIG. 28 is a plan schematic view illustrating a further alternative variation of the electrode pattern of this embodiment.

The electrode 4 of the AC-driven electrostatic chuck 1g according to this variation is shaped like a hexagon. The electrodes 4 are arranged like e.g. a honeycomb configuration throughout the major surface of the dielectric substrate 3.

Figure 29:
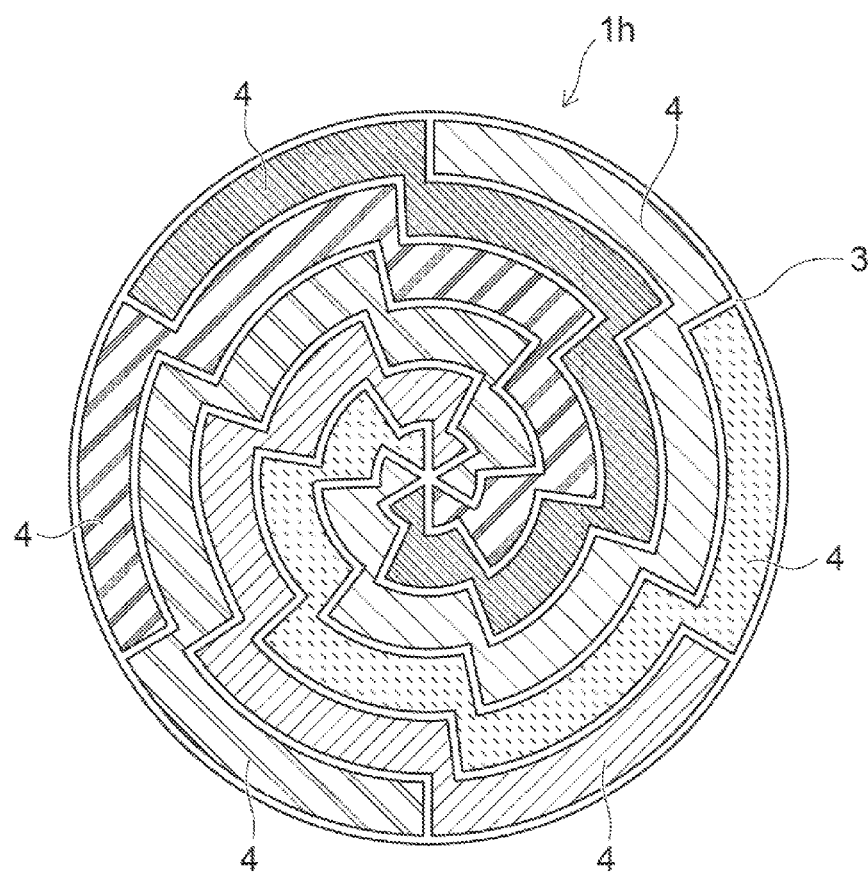
FIG. 29 is a plan schematic view illustrating a further alternative variation of the electrode pattern of this embodiment.

FIG. 29 is a plan schematic view illustrating a further alternative variation of the electrode pattern of this embodiment.

The electrode 4 of the AC-driven electrostatic chuck 1h according to this variation includes a plurality of electrode elements. The plurality of electrode elements are arranged generally spirally. The AC-driven electrostatic chuck 1h according to this variation includes six electrodes 4. The six electrodes 4 are paired two by two. That is, the six electrodes 4 form three pairs. Thus, the electrodes 4 of the AC-driven electrostatic chuck 1h according to this variation are applied with a three-phase AC voltage.

Figure 30:
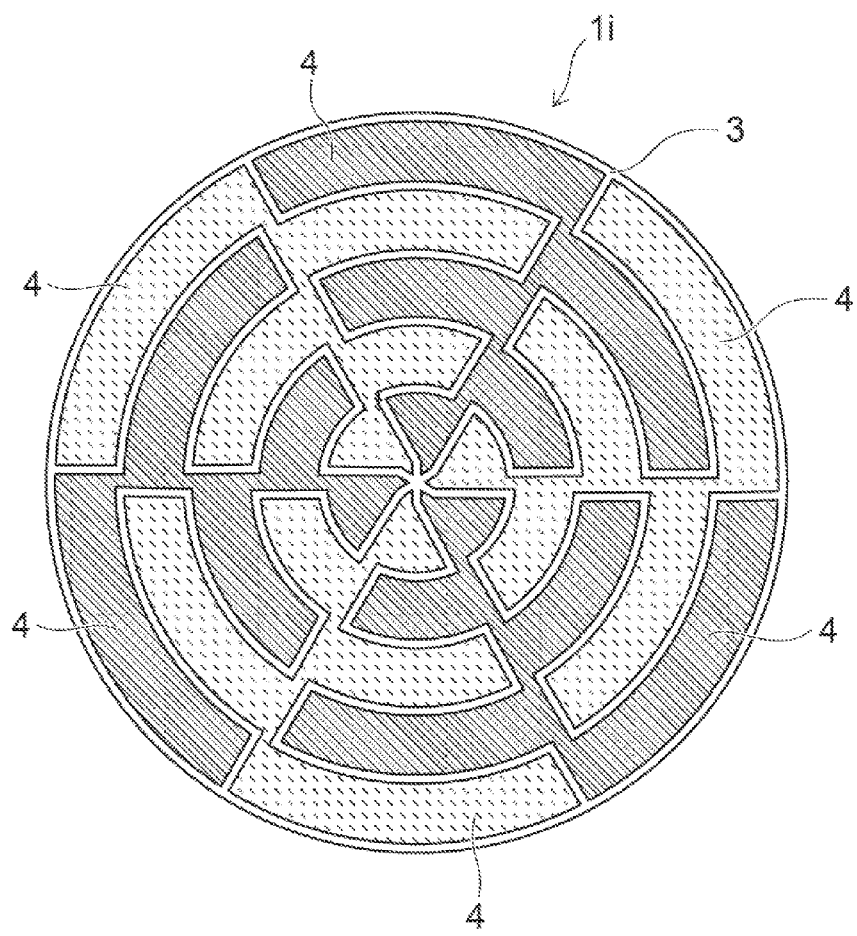
FIG. 30 is a plan schematic view illustrating a further alternative variation of the electrode pattern of this embodiment.

FIG. 30 is a plan schematic view illustrating a further alternative variation of the electrode pattern of this embodiment.

The electrode 4 of the AC-driven electrostatic chuck 1i according to this variation includes a plurality of electrode elements. The plurality of electrode elements are arranged generally concentrically. The AC-driven electrostatic chuck 1i according to this variation includes six electrodes 4. The six electrodes 4 are paired two by two. That is, the six electrodes 4 form three pairs. Thus, the electrodes 4 of the AC-driven electrostatic chuck 1i according to this variation are applied with a three-phase AC voltage.

Figure 31:
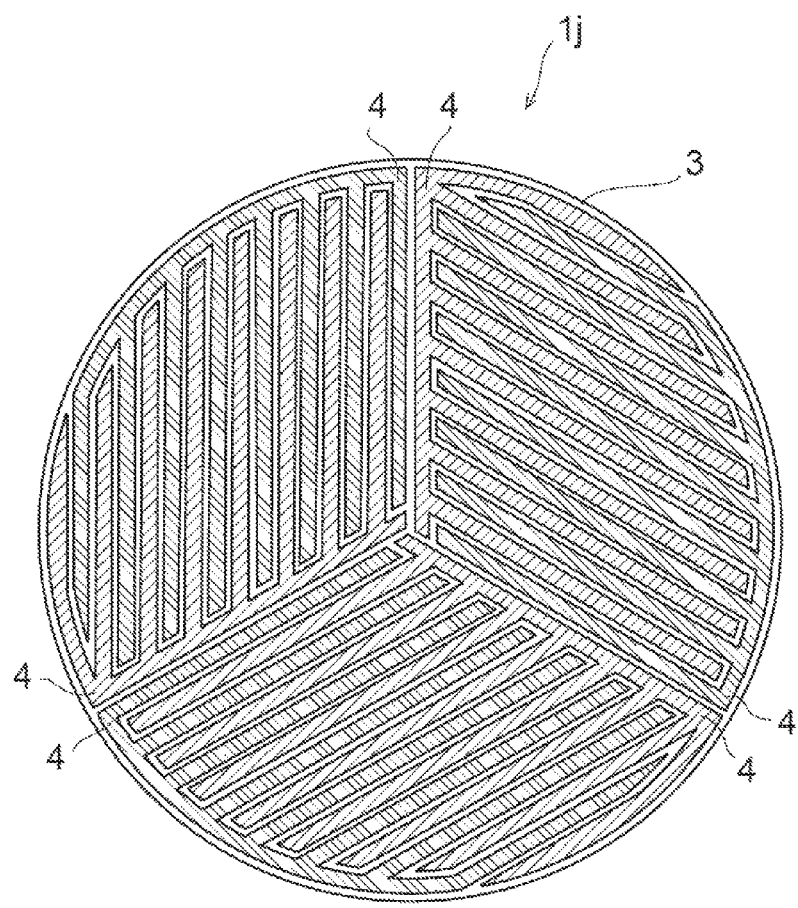
FIG. 31 is a plan schematic view illustrating a further alternative variation of the electrode pattern of this embodiment.

FIG. 31 is a plan schematic view illustrating a further alternative variation of the electrode pattern of this embodiment.

The electrode 4 of the AC-driven electrostatic chuck 1j according to this variation is shaped like a comb. The AC-driven electrostatic chuck 1j according to this variation includes six electrodes 4. The six electrodes 4 are paired two by two. The paired electrodes 4 are arranged so that a comb tooth of one electrode 4 is inserted between the mutually adjacent comb teeth of the other electrode 4. The six electrodes 4 form three pairs. Thus, the electrodes 4 of the AC-driven electrostatic chuck 1i according to this variation are applied with a three-phase AC voltage.

Figure 32:
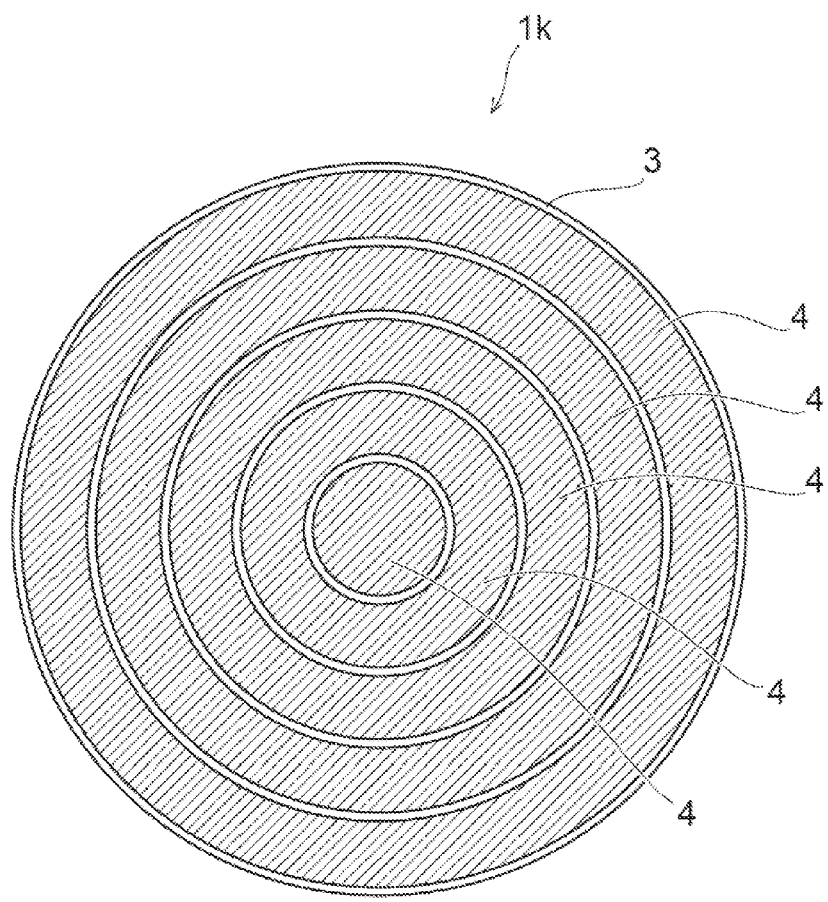
FIG. 32 is a plan schematic view illustrating a further alternative variation of the electrode pattern of this embodiment.

FIG. 32 is a plan schematic view illustrating a further alternative variation of the electrode pattern of this embodiment.

The electrode 4 of the AC-driven electrostatic chuck 1k according to this variation includes a plurality of electrode elements. The plurality of electrode elements are arranged concentrically. The AC-driven electrostatic chuck 1k according to this variation includes five electrodes 4.

The variations of the pattern of the electrodes 4 of this embodiment have been illustrated above with reference to FIG. 24 to FIG. 32. Also in these patterns of the electrodes 4, the electrode 4 and the protrusion 3a have the arrangement relationship described above with reference to FIG. 4A, FIG. 4B, and FIG. 14 to FIG. 21. This achieves an effect similar to the effect described above with reference to FIG. 4A, FIG. 4B, and FIG. 14 to FIG. 21.

Next, major numerical values related to the electrode 4 and the protrusion 3a of this embodiment are described with reference to the drawings.

Figure 33:
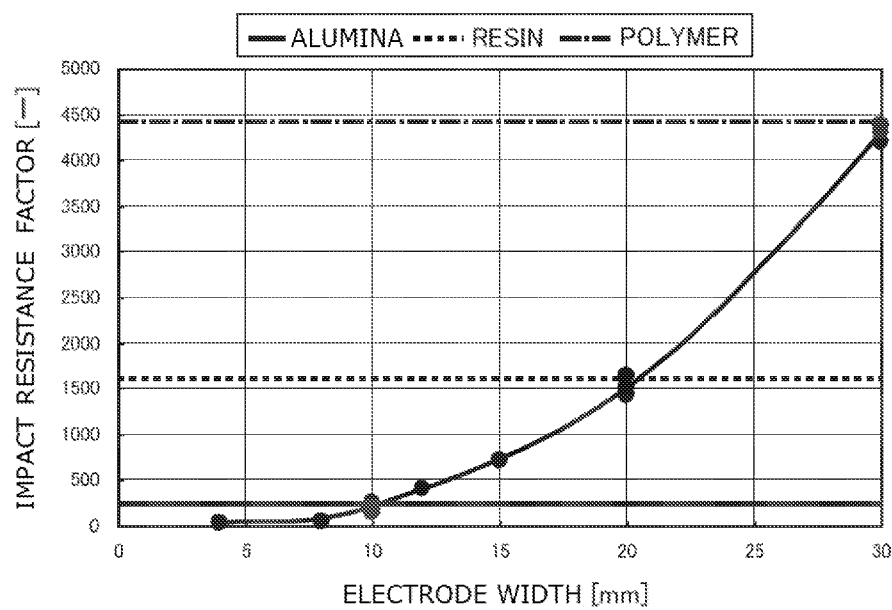
FIG. 33 is a graph illustrating an example of the relationship between the electrode width and the impact resistance factor.

FIG. 33 is a graph illustrating an example of the relationship between the electrode width and the impact resistance factor.

The horizontal axis shown in FIG. 33 represents the electrode width of the electrode 4. The vertical axis shown in FIG. 33 represents the impact resistance factor of the dielectric substrate 3. In this description, the "impact resistance factor" is defined as "tensile strength/impact stress (impact value)".

As described above with reference to FIG. 7A to FIG. 8C, the clamped object 20 is locally displaced or vibrated by the application pattern of AC voltage. This may cause damage to the protrusion 3a. The degree of the damage caused to the protrusion 3a depends on e.g. the material of the dielectric substrate 3. As described above with reference to FIG. 1A to FIG. 1C, the dielectric substrate 3 is formed from e.g. a polycrystalline ceramic sintered body. The polycrystalline ceramic sintered body can be a polycrystalline ceramic sintered body made of e.g. alumina, yttria, aluminum nitride, or silicon carbide.

However, the material of the dielectric substrate 3 is not limited thereto, but may be a polymer compound such as silicone rubber, or a resin such as polyimide (PI). Thus, the inventor has defined the aforementioned impact resistance factor to obtain a unified representation by the numerical value specific to the material of the dielectric substrate 3. A smaller impact on the dielectric substrate 3 is preferable. Thus, a lower impact resistance factor is preferable.

As shown in FIG. 33, in view of the impact resistance factor of polymer compounds, it is preferable that the electrode width of the electrode 4 be approximately 30 mm or less. In view of the impact resistance factor of resin, it is preferable that the electrode width of the electrode 4 be approximately 20 mm or less. In view of the impact resistance factor of alumina, it is more preferable that the electrode width of the electrode 4 be approximately 10 mm or less. This can prevent local damage to part of the protrusions 3a.

Figure 34:
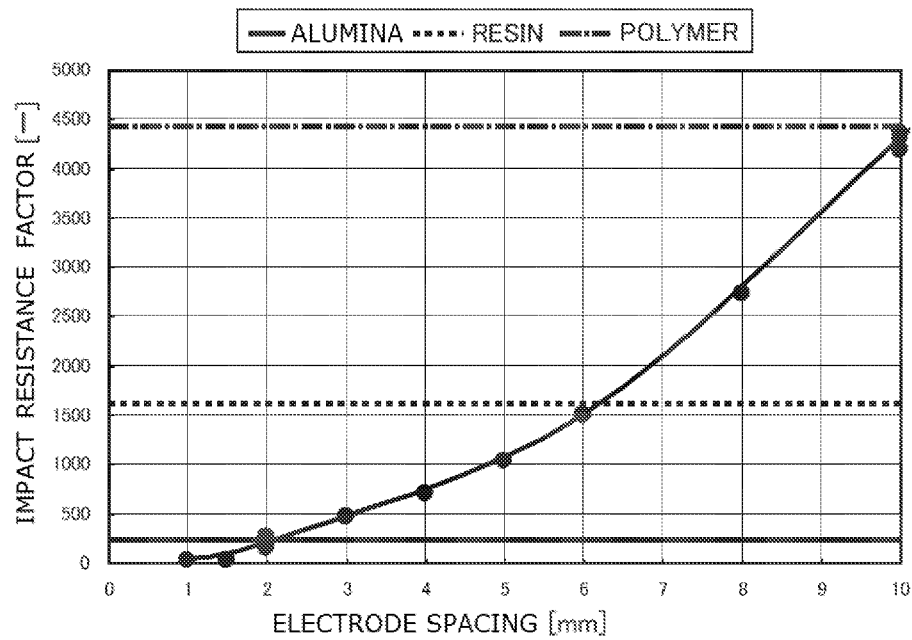
FIG. 34 is a graph illustrating an example of the relationship between the electrode spacing and the impact resistance factor.

FIG. 34 is a graph illustrating an example of the relationship between the electrode spacing and the impact resistance factor.

The horizontal axis shown in FIG. 34 represents the spacing between the adjacent electrodes 4. The spacing between the adjacent electrodes 4 is the width of the gap 14 as viewed in the direction perpendicular to the extending direction of the gap 14. The vertical axis shown in FIG. 34 represents the impact resistance factor of the dielectric substrate 3. The impact resistance factor is as described above with reference to FIG. 33.

As shown in FIG. 34, in view of the impact resistance factor of polymer compounds, it is preferable that the spacing between the adjacent electrodes 4 be approximately 10 mm or less. In view of the impact resistance factor of resin, it is more preferable that the spacing between the adjacent electrodes 4 be approximately 6 mm or less. In view of the impact resistance factor of alumina, it is more preferable that the spacing between the adjacent electrodes 4 be approximately 2 mm or less. This can prevent local damage to part of the protrusions 3a.

Figure 35:
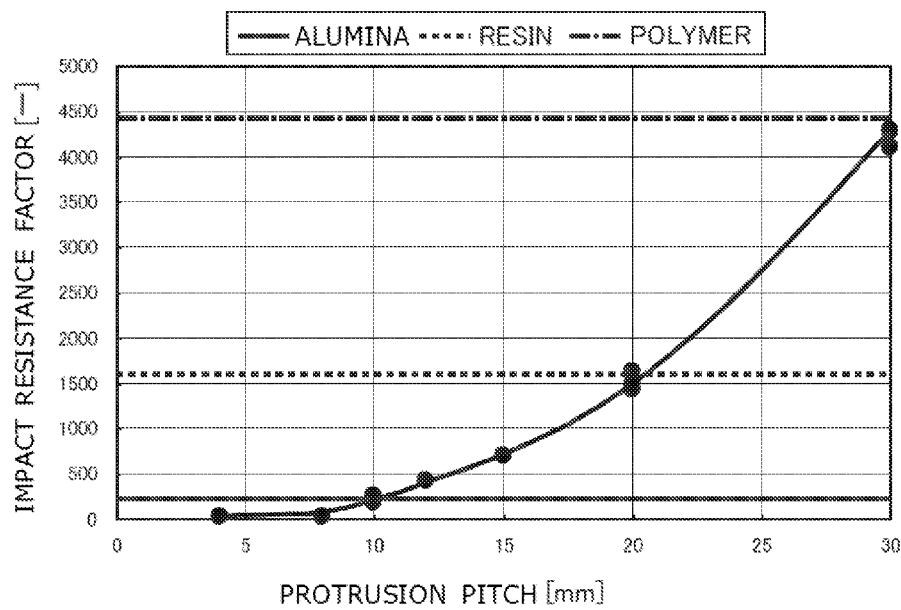
FIG. 35 is a graph illustrating an example of the relationship between the protrusion pitch and the impact resistance factor.

FIG. 35 is a graph illustrating an example of the relationship between the protrusion pitch and the impact resistance factor.

The horizontal axis shown in FIG. 35 represents the spacing between the centers of the adjacent protrusions 3a (dot pitch). The vertical axis shown in FIG. 35 represents the impact resistance factor of the dielectric substrate 3. The impact resistance factor is as described above with reference to FIG. 33.

As shown in FIG. 35, in view of the impact resistance factor of polymer compounds, it is preferable that the spacing between the centers of the adjacent protrusions 3a be approximately 30 mm or less. In view of the impact resistance factor of resin, it is more preferable that the spacing between the centers of the adjacent protrusions 3a be approximately 20 mm or less. In view of the impact resistance factor of alumina, it is more preferable that the spacing be approximately 10 mm or less. This can prevent local damage to part of the protrusions 3a.

Figure 36:
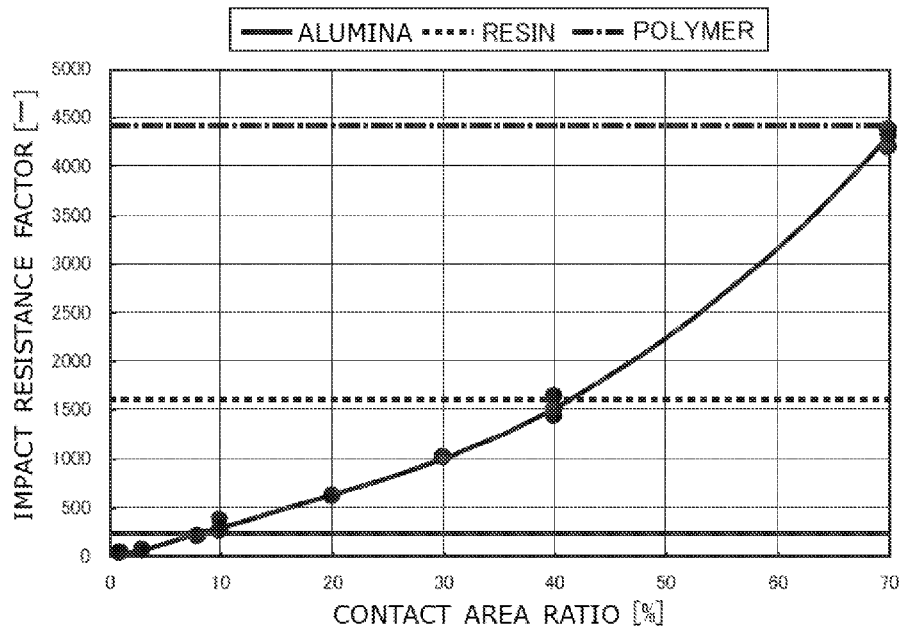
FIG. 36 is a graph illustrating an example of the relationship between the contact area ratio and the impact resistance factor.

FIG. 36 is a graph illustrating an example of the relationship between the contact area ratio and the impact resistance factor.

The horizontal axis shown in FIG. 36 represents the ratio of the area of the top surface of the protrusions 3a to the total area of the major surface of the dielectric substrate 3 as viewed perpendicularly to the major surface of the dielectric substrate 3 (contact area ratio). Here, in the case where a ring-shaped protrusion is disposed at least on the outer peripheral part of the dielectric substrate 3 and around the through hole, not shown, the area of the top surface of the protrusions 3a shall include the area of the top surface of the ring-shaped protrusion. The vertical axis shown in FIG. 36 represents the impact resistance factor of the dielectric substrate 3. The impact resistance factor is as described above with reference to FIG. 33.

As shown in FIG. 36, in view of the impact resistance factor of polymer compounds, it is preferable that the contact area ratio be approximately 70 percent (%) or less. In view of the impact resistance factor of resin, it is more preferable that the contact area ratio be approximately 50% or less. In view of the impact resistance factor of alumina, it is more preferable that the contact area ratio be approximately 10% or less. This can prevent local damage to part of the protrusions 3a.

Figure 37:
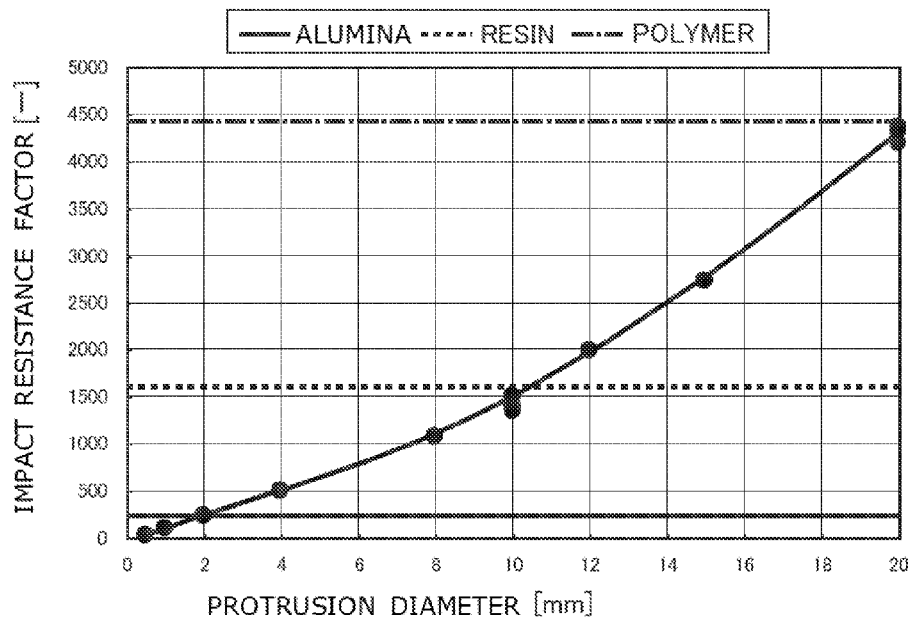
FIG. 37 is a graph illustrating an example of the relationship between the protrusion diameter and the impact resistance factor.

FIG. 37 is a graph illustrating an example of the relationship between the protrusion diameter and the impact resistance factor.

The horizontal axis shown in FIG. 37 represents the diameter of the protrusion 3a. The vertical axis shown in FIG. 37 represents the impact resistance factor of the dielectric substrate 3. The impact resistance factor is as described above with reference to FIG. 33.

In the case where the shape of the protrusion 3a as viewed perpendicularly to the major surface of the dielectric substrate 3 is not a circle, the diameter of the protrusion 3a shall refer to the circle equivalent diameter. The "circle equivalent diameter" is as described above with reference to FIGS. 23A and 23B.

As shown in FIG. 37, in view of the impact resistance factor of polymer compounds, it is preferable that the diameter of the protrusion 3a be approximately Ø20 mm or less. In view of the impact resistance factor of resin, it is more preferable that the diameter of the protrusion 3a be approximately Ø10 mm or less. In view of the impact resistance factor of alumina, it is more preferable that the diameter of the protrusion 3a be approximately Ø2 mm or less. This can prevent local damage to part of the protrusions 3a.

Figure 38:
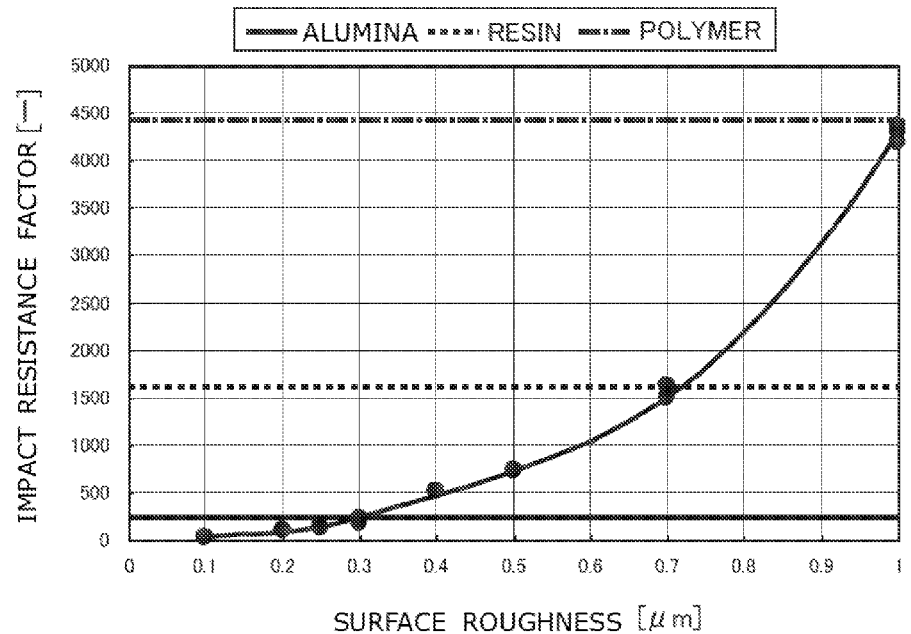
FIG. 38 is a graph illustrating an example of the relationship between the surface roughness of the top surface of the protrusion and the impact resistance factor.

FIG. 38 is a graph illustrating an example of the relationship between the surface roughness of the top surface of the protrusion and the impact resistance factor.

The horizontal axis shown in FIG. 38 represents the arithmetic mean roughness Ra of the top surface of the protrusion 3a. Here, in the case where a ring-shaped protrusion is disposed at least on the outer peripheral part of the dielectric substrate 3 and around the through hole, not shown, the top surface of the protrusions 3a shall include the top surface of the ring-shaped protrusion. The vertical axis shown in FIG. 38 represents the impact resistance factor of the dielectric substrate 3. The impact resistance factor is as described above with reference to FIG. 33.

As shown in FIG. 38, in view of the impact resistance factor of polymer compounds, it is preferable that the arithmetic mean roughness Ra of the top surface of the protrusion 3a be approximately 1 μm or less. In view of the impact resistance factor of resin, it is more preferable that the arithmetic mean roughness Ra of the top surface of the protrusion 3a be approximately 0.7 μm or less. In view of the impact resistance factor of alumina, it is more preferable that the arithmetic mean roughness Ra of the top surface of the protrusion 3a be approximately 0.3 μm or less. This can prevent local damage to part of the protrusions 3a.

The embodiments of the invention have been described above. However, the invention is not limited to the above description. Those skilled in the art can appropriately modify the above embodiments, and such modifications are also encompassed within the scope of the invention as long as they include the features of the invention. For instance, the shape, dimension, material, arrangement and the like of various components in the AC-driven electrostatic chuck 1 and the like, and the installation configuration and the like of the protrusion 3a and the electrode 4 are not limited to those illustrated, but can be modified appropriately.

The waveform of the AC voltage applied to the electrode 4 can be e.g. a sinusoidal wave, rectangular wave or the like. However, the waveform is not limited thereto. The effective value, amplitude, and phase of the AC voltage applied to the electrode 4 are also not particularly limited. The frequency of the AC voltage applied to the electrode 4 can be e.g. approximately 0.1-500 hertz (Hz). However, the frequency is not limited thereto.

Furthermore, various components in the above embodiments can be combined with each other as long as technically feasible. Such combinations are also encompassed within the scope of the invention as long as they include the features of the invention.

INDUSTRIAL APPLICABILITY

The aspects of the invention provide an AC-driven electrostatic chuck capable of suppressing local damage to part of the protrusions provided on the mounting surface side.

REFERENCE SIGNS LIST 1, 1a, 1b, 1c, 1d, 1e, 1f, 1g, 1h, 1i, 1j, 1k AC-driven electrostatic chuck
2 base
3 dielectric substrate
3a protrusion
3a1 top surface
3a2 protrusion
3b bottom surface part
3c space
4 electrode
4a first-phase electrode
4b second-phase electrode
4c third-phase electrode
4d center line
4e end part
4f sector
5 insulator layer
6 bonding layer
8 flow channel
9 electric wire
10a, 10b power supply
11 through hole
14 gap
14d center line
14e end part
20 clamped object
30 dielectric substrate

The invention claimed is:
1. An AC-driven electrostatic chuck comprising:
a dielectric substrate having a major surface which is configured to support thereon an object which is to be electrostatically clamped by the chuck, the major surface having a bottom part and a plurality of protrusions which extend upwardly from the bottom part; and
an electrode provided in the dielectric substrate,
the electrode including a plurality of electrode elements spaced from each other with gaps therebetween,
the plurality of electrode elements being configured to be applied with an AC voltage of mutually different phases, respectively, and
the plurality of protrusions being arranged on the major surface with a prescribed spacing therebetween based on each shape of the plurality of electrode elements such that the protrusions are at positions only on a projection image of the electrode elements obtained by projecting each shape of the plurality of electrode elements on the major surface.

2. The chuck according to claim 1, wherein
the plurality of protrusions are at positions not located on center lines of the electrode elements of the projection image.
3. The chuck according to claim 2, wherein the plurality of protrusions are at positions symmetric with respect to the center lines of the electrode elements of the projection image.
4. The chuck according to claim 1, wherein
the plurality of protrusions are at positions symmetric with respect to center lines of the gaps between the electrode elements of the projection image.
5. The chuck according to claim 1, wherein
the plurality of protrusions exist are on center lines of the electrode elements of the projection image.
6. The chuck according to claim 5, wherein the protrusions arranged on an outer peripheral part of the major surface are arranged at positions of the projection image of the electrode elements selectively shifted toward an outer periphery of the major surface, while the plurality of protrusions arranged on a central part of the major surface are not, as viewed perpendicularly to the major surface.
7. The chuck according to claim 5, wherein the electrode elements are arranged in tracks separated from each other in a radial direction of the electrode, and the protrusions arranged on the track second from an outermost periphery of the major surface as viewed perpendicularly to the major surface are arranged at positions of the projection image of the electrode elements selectively shifted toward the outermost periphery of the major surface, while the plurality of protrusions arranged on other than the second track from the outermost periphery are not, as viewed perpendicularly to the major surface.
8. The chuck according to claim 1, wherein spacing between adjacent ones of the plurality of protrusions arranged on a central part of the major surface is narrower than spacing between adjacent ones of the plurality of protrusions arranged on an outer peripheral part of the major surface.
9. The chuck according to claim 1, wherein the gaps between adjacent ones of the plurality of electrode elements arranged on a central part of the major surface have narrower width than that of the gaps between adjacent ones of the plurality of electrode elements arranged on an outer peripheral part of the major surface.
10. The chuck according to claim 1, wherein a ratio of area of top surfaces of the plurality of protrusions arranged on a central part of the major surface to total area of the major surface is higher than a ratio of area of top surfaces of the plurality of protrusions arranged on an outer peripheral part of the major surface to the total area of the major surface as viewed perpendicularly to the major surface.
11. The chuck according to claim 1, wherein each diameter of the protrusions arranged on an outer peripheral part of the major surface is equal to or larger than each diameter of the protrusions arranged on a central part of the major surface.
12. The chuck according to claim 1, wherein the plurality of electrode elements are configured to be applied with an AC voltage of three mutually different phases.
13. The chuck according to claim 1, wherein the plurality of electrode elements are configured to be applied with an AC voltage having a frequency of 0.1-500 Hz.
14. An AC-driven electrostatic chuck comprising:
a dielectric substrate having a major surface which is configured to support thereon an object which is to be electrostatically clamped by the chuck without any intervening conductor, the major surface having a bottom part and a plurality of protrusions which extend upwardly from the bottom part; and an electrode provided in the dielectric substrate,
the electrode including a plurality of electrode elements spaced from each other with gaps therebetween,
the plurality of electrode elements being configured to be applied with an AC voltage of mutually different phases, respectively, and
the plurality of protrusions being arranged on the major surface with a prescribed spacing therebetween based on each shape of the plurality of electrode elements such that the protrusions are at positions not located on a projection image of the electrode elements obtained by projecting each shape of the plurality of electrode elements on the major surface.

15. The chuck according to claim 14, wherein
the plurality of protrusions are at positions not located on center lines of the gaps between the electrode elements of the projection image.

16. The chuck according to claim 15, wherein the plurality of protrusions are at positions symmetric with respect to the center lines of the gaps between the electrode elements of the projection image.

17. The chuck according to claim 14, wherein
the plurality of protrusions are at positions located on center lines of the gaps between the electrode elements of the projection image.

18. The chuck according to claim 17, wherein the protrusions arranged on an outer peripheral part of the major surface are arranged at positions of the projection image of the electrode elements selectively shifted toward an outer periphery of the major surface, while the plurality of protrusions arranged on a central part of the major surface are not, as viewed perpendicularly to the major surface.

19. The chuck according to claim 17, wherein the electrode elements are arranged in tracks separated from each other in a radial direction of the electrode, and the protrusions arranged on the track second from an outermost periphery of the major surface as viewed perpendicularly to the major surface are arranged at positions of the projection image of the electrode elements selectively shifted toward the outermost periphery of the major surface, while the plurality of protrusions arranged on other than the second track from the outermost periphery are not, as viewed perpendicularly to the major surface.

20. The chuck according to claim 14, wherein spacing between adjacent ones of the plurality of protrusions arranged on a central part of the major surface is narrower than spacing between adjacent ones of the plurality of protrusions arranged on an outer peripheral part of the major surface.

21. The chuck according to claim 14, wherein spacing between adjacent ones of the plurality of electrode elements arranged on a central part of the major surface is narrower than spacing between adjacent ones of the plurality of electrode elements arranged on an outer peripheral part of the major surface.

22. The chuck according to claim 14, wherein a ratio of area of top surfaces of the plurality of protrusions arranged on a central part of the major surface to total area of the major surface is higher than a ratio of area of top surfaces of the plurality of protrusions arranged on an outer peripheral part of the major surface to the total area of the major surface as viewed perpendicularly to the major surface.

23. The chuck according to claim 14, wherein each diameter of the protrusions arranged on an outer peripheral part of the major surface is equal to or larger than each diameter of the protrusions arranged on a central part of the major surface.

24. The chuck according to claim 14, wherein the plurality of electrode elements are configured to be applied with an AC voltage of three mutually different phases.

25. The chuck according to claim 14, wherein the plurality of electrode elements are configured to be applied with an AC voltage having a frequency of 0.1-500 Hz.

* * * * *